United States Patent
Shang Guan

(10) Patent No.: US 11,127,336 B2
(45) Date of Patent: Sep. 21, 2021

(54) GATE ON ARRAY (GOA) UNIT, GATE DRIVER CIRCUIT AND DISPLAY DEVICE

(71) Applicant: BOE TECHNOLOGY GROUP CO., LTD., Beijing (CN)

(72) Inventor: Xingchen Shang Guan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/670,065

(22) Filed: Oct. 31, 2019

(65) Prior Publication Data

US 2020/0066201 A1 Feb. 27, 2020

Related U.S. Application Data

(63) Continuation-in-part of application No. 15/324,881, filed as application No. PCT/CN2016/073981 on Feb. 18, 2016.

(30) Foreign Application Priority Data

Sep. 23, 2015 (CN) .......................... 201510614177.5

(51) Int. Cl.
*G11C 19/00* (2006.01)
*G09G 3/20* (2006.01)
(Continued)

(52) U.S. Cl.
CPC ............. *G09G 3/2092* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 8,536,466 B2 * 9/2013 Shimizu .................. H02S 40/34
174/520
9,406,400 B2 8/2016 Kuo
(Continued)

FOREIGN PATENT DOCUMENTS

| CN | 104091574 A | 10/2014 |
| CN | 104318886 A | 1/2015 |

(Continued)

OTHER PUBLICATIONS

First European Office Action dated Nov. 27, 2019.
(Continued)

*Primary Examiner* — Tuan T Lam
(74) *Attorney, Agent, or Firm* — Dilworth & Barrese, LLP.; Michael J. Musella, Esq.

(57) ABSTRACT

A gate on array (GOA) unit, a gate driver circuit, and a display device are provided. The GOA unit includes a driver circuit, a pull-down circuit, and a pull-down control circuit, the driver circuit is configured to output a first signal from an output end of the GOA unit. The pull-down circuit is connected with the driver circuit and at least one voltage end that provides a voltage signal, the pull-down circuit is configured to input the voltage signal into a control end of the driver circuit to drive the driver circuit to be in an off state when the GOA unit outputs an off signal. The pull-down control circuit is connected with the pull-down circuit and the driver circuit, and is configured to control the pull-down circuit to input the voltage signal to the control end of the driver circuit.

20 Claims, 11 Drawing Sheets

(51) Int. Cl.
  *G11C 19/28* (2006.01)
  *G09G 3/36* (2006.01)
(52) U.S. Cl.
  CPC ... *G11C 19/287* (2013.01); *G09G 2300/0408* (2013.01); *G09G 2310/0254* (2013.01); *G09G 2310/0286* (2013.01)

(56) References Cited

U.S. PATENT DOCUMENTS

| | | | |
|---|---|---|---|
| 9,627,089 B2* | 4/2017 | Qi | G11C 19/184 |
| 2007/0247932 A1 | 10/2007 | Tobita | |
| 2007/0274433 A1* | 11/2007 | Tobita | G09G 3/3677 377/64 |
| 2008/0219401 A1* | 9/2008 | Tobita | G09G 3/3677 377/79 |
| 2010/0226473 A1 | 9/2010 | Liu | |
| 2011/0058640 A1 | 3/2011 | Shang | |
| 2011/0116592 A1* | 5/2011 | Tsai | G11C 19/184 377/79 |
| 2012/0098804 A1* | 4/2012 | Ohhashi | G11C 19/184 345/204 |
| 2012/0113088 A1 | 5/2012 | Han et al. | |
| 2012/0256817 A1 | 10/2012 | Chen | |
| 2012/0269316 A1 | 10/2012 | Jang | |
| 2014/0023173 A1* | 1/2014 | Miyake | G11C 19/28 377/54 |
| 2014/0064438 A1 | 3/2014 | Wu | |
| 2014/0098013 A1 | 4/2014 | Chen | |
| 2015/0043703 A1 | 2/2015 | Tan | |
| 2015/0077319 A1 | 3/2015 | Yao et al. | |
| 2015/0228353 A1 | 8/2015 | Qing | |
| 2015/0279288 A1 | 10/2015 | Dai | |
| 2015/0294733 A1 | 10/2015 | Tan | |
| 2016/0019126 A1 | 1/2016 | Kwon | |
| 2016/0049128 A1 | 2/2016 | Shao | |
| 2016/0293091 A1 | 10/2016 | Wang | |
| 2016/0293092 A1 | 10/2016 | Li et al. | |
| 2016/0351109 A1 | 12/2016 | Han et al. | |
| 2017/0011699 A1 | 1/2017 | Wang | |
| 2017/0039968 A1 | 2/2017 | Chen | |
| 2017/0079173 P1 | 3/2017 | Bourne | |
| 2017/0092375 A1 | 3/2017 | Xia | |
| 2017/0116924 A1 | 4/2017 | Zhang | |

FOREIGN PATENT DOCUMENTS

| | | |
|---|---|---|
| CN | 104505049 A | 4/2015 |
| CN | 104766580 A | 7/2015 |
| CN | 104835476 A | 8/2015 |
| CN | 104867472 A | 8/2015 |
| CN | 105096811 A | 11/2015 |
| CN | 204966012 U | 1/2016 |
| KR | 20140098880 A | 8/2014 |
| WO | 2015010364 A1 | 1/2015 |

OTHER PUBLICATIONS

International Search Report dated Jun. 15, 2016.
First Chinese Office Action dated Sep. 2, 2016.
Second Chinese Office Action dated May 15, 2017.
European Search Report issued by the European Patent Office for the corresponding European Patent Application No. 15902804.2. The Search Report has an issue date of Feb. 18, 2019.

* cited by examiner

GATE ON ARRAY (GOA) UNIT, GATE DRIVER CIRCUIT AND DISPLAY DEVICE

CROSS-REFERENCE TO RELATED APPLICATION

This application is a continuation-in-part of application Ser. No. 15/324,881, filed Jan. 9, 2017 which was the National Stage of international Application No. PCT/CN2016/073981, filed Feb. 18, 2016, which claimed priority to Chinese Patent Application No. 201510614177.5, filed Sep. 23, 2015, the entire disclosures each of which are hereby entirely incorporated by reference.

TECHNICAL FIELD

The present disclosure relates to the field of display technology, in particular to a gate on array (GOA) unit, a gate driver circuit and a display device.

BACKGROUND

In a display device, a gate driver circuit provides on signals, so that a plurality of rows of pixels can be sequentially and progressively switched on, and hence display can be achieved. Generally, the gate driver circuit includes multi-stage shift registers, and each shift register corresponds to one row of pixels. Before switching on a row of pixels, a shift register corresponding to the row of pixels generates a driving signal, which is hence inputted into a gate line connected with the row of pixels, thereby driving the row of pixels to be switched on.

Currently, in order to obtain light and thin display devices, more and more gate driver circuits adopt GOA technology. In the technology, a gate driver chip is disposed on an array substrate. In the gate driver circuit adopting the GOA technology, the shift registers are referred to as GOA units.

In the current display device, each GOA unit outputs an off signal after driving one row of pixels corresponding to the GOA unit to be switched on and is in a flooding state. In this case, due to signal crosstalk, the GOA unit in the flooding state can be easily and incorrectly switched on by a signal which is coupled in, causing one row of pixels that correspond to the GOA unit to be charged and switched on. Hence, incorrect images can be displayed, that is, an "abnormal image" phenomenon can be caused.

SUMMARY

Embodiments of the present disclosure provide a GOA unit, a gate driver circuit and a display device in order to solve at least the above technical problems in existing technologies, which can avoid the incorrect switching-on of one row of pixels corresponding to the GOA unit, so that the row of pixels cannot be charged and display incorrect images, and hence the "abnormal image" phenomenon can be overcome.

Embodiments of the present disclosure provide a gate on array (GOA) unit, comprising: a driver circuit configured to output a first clock signal from an output end of the GOA unit; and a pull-down circuit connected with the driver circuit, the pull-down circuit also connected with at least one low-voltage end that provides a low-voltage signal, the pull-down circuit configured to input the low-voltage signal into a control end of the driver circuit to drive the driver circuit to be in an off state when the GOA unit outputs an off signal.

The pull-down circuit includes a first sub-circuit, a second sub-circuit and a third sub-circuit. A first end of the first sub-circuit is connected with the control end of the driver circuit; a second end of the first sub-circuit is connected with the at least one low-voltage end; a third end of the first sub-circuit is connected with the second sub-circuit and the third sub-circuit. A first end of the second sub-circuit is connected with a signal input end; a second end of the second sub-circuit is connected with a second clock signal; a third end of the second sub-circuit is connected with the third end of the first sub-circuit. A first end of the third sub-circuit is connected with the at least one low-voltage end; a second end of the third sub-circuit is connected with the control end of the driver circuit; and a third end of the third sub-circuit is connected with the third end of the first sub-circuit.

The pull-down circuit further includes a fourth sub-circuit. A first end of the fourth sub-circuit is connected with the output end of the GOA unit; a second end of the fourth sub-circuit is connected with the at least one low-voltage end; and a third end of the fourth sub-circuit is connected with the third end of the second sub-circuit and the third end of the third sub-circuit.

The second sub-circuit includes a first transistor and a second transistor. A control electrode of the first transistor is the second end of the second sub-circuit and connected with the second clock signal; a source electrode of the first transistor is the first end of the second sub-circuit and connected with the signal input end; a drain electrode of the first transistor is connected with a control electrode and a source electrode of the second transistor. A drain electrode of the second transistor is the third end of the second sub-circuit and connected with the third end of the first sub-circuit. A high voltage signal or the second clock signal is inputted from the signal input end.

The third sub-circuit includes a third transistor. A control electrode of the third transistor is the second end of the third sub-circuit and connected with the control end of the driver circuit; a source electrode of the third transistor is the first end of the third sub-circuit and connected with the at least one low-voltage end; and a drain electrode of the third transistor is the third end of the third sub-circuit and connected with the third end of the first sub-circuit.

The first sub-circuit includes a fourth transistor. A control electrode of the fourth transistor is the third end of the first sub-circuit and connected with the second sub-circuit and the third sub-circuit; a source electrode of the fourth transistor is the second end of the first sub-circuit and connected with the at least one low-voltage end; and a drain electrode of the fourth transistor is the first end of the first sub-circuit and connected with the control end of the driver circuit.

The fourth sub-circuit includes a fifth transistor. A control electrode of the fifth transistor is the third end of the fourth sub-circuit and connected with the third end of the second sub-circuit and the third end of the third sub-circuit; a source electrode of the fifth transistor is the second end of the fourth sub-circuit and connected with the at least one low-voltage end; and a drain electrode of the fifth transistor is the first end of the fourth sub-circuit and connected with the output end of the GOA unit.

The first sub-circuit includes a fourth transistor; the second sub-circuit includes a first transistor and a second transistor; the third sub-circuit includes a third transistor. A control electrode of the first transistor is connected with the second clock signal; a source electrode of the first transistor is connected with the signal input end; a drain electrode of the first transistor is connected with a control electrode and a source electrode of the second transistor. A drain electrode of the second transistor is connected with a control electrode of the fourth transistor. A control electrode of the third transistor is connected with the control end of the driver circuit; a source electrode of the third transistor is connected with the at least one low-voltage end; a drain electrode of the third transistor is connected with a control electrode of the fourth transistor. A source electrode of the fourth transistor is connected with the at least one low-voltage end; a drain electrode of the fourth transistor is connected with the control end of the driver circuit. A high voltage signal or the second clock signal is inputted from the signal input end.

A low-voltage end connected with the source electrode of the third transistor and a low-voltage end connected with the source electrode of the fourth transistor are a same voltage end.

The pull-down circuit further includes a fourth sub-circuit; the fourth sub-circuit includes a fifth transistor. A control electrode of the fifth transistor is connected with the control electrode of the fourth transistor; a source electrode of the fifth transistor is connected with the at least one low-voltage end; and a drain electrode of the fifth transistor is connected with the output end of the GOA unit.

A low-voltage end connected with the source electrode of the third transistor, a low-voltage end connected with the source electrode of the fourth transistor, and a low-voltage end connected with the source electrode of the fifth transistor are a same voltage end.

The GOA unit further includes a pull-up circuit. An output end of the pull-up circuit is connected with the driver circuit so as to input a pull-up signal into the driver circuit; and the pull-up signal is configured to drive the driver circuit to be switched on.

The driver circuit includes a driving transistor. A control electrode of the driving transistor is the control end of the driver circuit and connected with the output end of the pull-up circuit; a source electrode of the driving transistor is connected with the first clock signal; and a drain electrode of the driving transistor is connected with the output end of the GOA unit.

The GOA unit further includes a reset circuit. The reset circuit is connected with the driver circuit and configured to input the low-voltage signal into the control end of the driver circuit and the output end of the GOA unit; and the low-voltage signal is configured to drive the driver circuit to be switched off and pull down a signal outputted by the GOA unit.

The pull-up circuit includes a sixth transistor and a first capacitor. A control electrode and a source electrode of the sixth transistor are connected with the pull-up signal; a drain electrode of the sixth transistor is connected with the control electrode of the driving transistor. A first end of the first capacitor is connected between the drain electrode of the sixth transistor and the control electrode of the driving transistor; and a second end of the first capacitor is connected with the output end of the GOA unit.

The reset circuit includes an eighth transistor and a ninth transistor. A control electrode of the eighth transistor is connected with a signal reset end; a source electrode of the eighth transistor is connected with the at least one low-voltage end; a drain electrode of the eighth transistor is connected with the control end of the driver circuit. A control electrode of the ninth transistor is connected with the signal reset end; a source electrode of the ninth transistor is connected with the at least one low-voltage end; and a drain electrode of the ninth transistor is connected with the output end of the GOA unit.

The high voltage signal inputted from the signal input end is equal to a turn-on voltage of a gate driver circuit.

Embodiments of the present disclosure provide a gate on array (GOA) unit, comprising: a driver circuit, a pull-down circuit, and a pull-down control circuit. The driver circuit is configured to output a first signal from an output end of the GOA unit; the pull-down circuit is connected with the driver circuit, the pull-down circuit is also connected with at least one voltage end that provides a voltage signal, the pull-down circuit is configured to input the voltage signal into a control end of the driver circuit to drive the driver circuit to be in an off state when the GOA unit outputs an off signal; and the pull-down control circuit is connected with the pull-down circuit and the driver circuit, and is configured to control the pull-down circuit to input the voltage signal to the control end of the driver circuit.

The pull-down circuit includes a first sub-circuit, a second sub-circuit and a third sub-circuit; a first end of the first sub-circuit is connected with the control end of the driver circuit; a second end of the first sub-circuit is connected with the at least one voltage end; a third end of the first sub-circuit is connected with the second sub-circuit and the third sub-circuit; a first end of the second sub-circuit is connected with a signal input end; a second end of the second sub-circuit is connected with a second signal; a third end of the second sub-circuit is connected with the third end of the first sub-circuit; a first end of the third sub-circuit is connected with the at least one voltage end; a second end of the third sub-circuit is connected with the control end of the driver circuit; and a third end of the third sub-circuit is connected with the third end of the first sub-circuit.

The pull-down control circuit comprises a first control sub-circuit and a second control sub-circuit, a first end of the first control sub-circuit is connected with the control end of the driver circuit, a second end of the first control sub-circuit is connected with the first end of the first sub-circuit, and a third end of the first control sub-circuit receives a first sub-circuit control signal, a first end of the second control sub-circuit is connected with the third end of the first sub-circuit, a second end of the second control sub-circuit is connected with the third end of the second sub-circuit and the third end of the third sub-circuit, and a third end of the second control sub-circuit receives a second sub-circuit control signal.

A polarity of a voltage output by a voltage end connected to the first end of the third sub-circuit is opposite to a polarity of the first sub-circuit control signal.

The pull-down circuit further includes a fourth sub-circuit; a first end of the fourth sub-circuit is connected with the output end of the GOA unit; a second end of the fourth sub-circuit is connected with the at least one voltage end; and a third end of the fourth sub-circuit is connected with the third end of the second sub-circuit and the third end of the third sub-circuit.

The pull-down control circuit further comprises a third control sub-circuit, a first end of the third control sub-circuit is connected with the third end of the fourth sub-circuit, a second end of the third control sub-circuit is connected with the third end of the second sub-circuit and the third end of the third sub-circuit, and a third end of the third control sub-circuit receives a third sub-circuit control signal.

A voltage end connected to the first end of the third sub-circuit and a voltage end connected to the second end of the first sub-circuit are different voltage ends, an absolute value of a voltage output by the voltage end connected to the first end of the third sub-circuit is greater than an absolute value of a voltage output by the voltage end connected to the second end of the first sub-circuit, and/or a difference between an absolute value of a voltage output by the voltage end connected to the first end of the third sub-circuit and an absolute value of a voltage output by the voltage end connected to the second end of the first sub-circuit ranges from 0 volt to 3 volts.

The second sub-circuit includes a first transistor and a second transistor; a control electrode of the first transistor is the second end of the second sub-circuit and connected with the second signal; a source electrode of the first transistor is the first end of the second sub-circuit and connected with the signal input end; a drain electrode of the first transistor is connected with a control electrode and a source electrode of the second transistor; a drain electrode of the second transistor is the third end of the second sub-circuit and connected with the third end of the first sub-circuit; and an input voltage signal or the second signal is inputted from the signal input end.

The second sub-circuit includes a first transistor and a second transistor, the second end of the second sub-circuit comprises a control electrode of the first transistor and a control electrode of the second transistor, the control electrode of the first transistor receives the second signal; a source electrode of the first transistor is the first end of the second sub-circuit and connected with the signal input end; a drain electrode of the first transistor is connected with a source electrode of the second transistor; the control electrode of the second transistor receives the second signal, a drain electrode of the second transistor is the third end of the second sub-circuit and connected with the third end of the first sub-circuit; and an input voltage signal or the second signal is inputted from the signal input end.

The third sub-circuit includes a third transistor; a control electrode of the third transistor is the second end of the third sub-circuit and connected with the control end of the driver circuit; a source electrode of the third transistor is the first end of the third sub-circuit and connected with the at least one voltage end; and a drain electrode of the third transistor is the third end of the third sub-circuit and connected with the third end of the first sub-circuit.

The first sub-circuit includes a fourth transistor; a control electrode of the fourth transistor is the third end of the first sub-circuit and connected with the second sub-circuit and the third sub-circuit; a source electrode of the fourth transistor is the second end of the first sub-circuit and connected with the at least one voltage end; and a drain electrode of the fourth transistor is the first end of the first sub-circuit and connected with the control end of the driver circuit.

The fourth sub-circuit includes a fifth transistor; a control electrode of the fifth transistor is the third end of the fourth sub-circuit and connected with the third end of the second sub-circuit and the third end of the third sub-circuit; a source electrode of the fifth transistor is the second end of the fourth sub-circuit and connected with the at least one voltage end; and a drain electrode of the fifth transistor is the first end of the fourth sub-circuit and connected with the output end of the GOA unit.

The first control sub-circuit comprises a first control transistor, and the second control sub-circuit comprises a second control transistor, a control electrode of the first control transistor is the third end of the first control sub-circuit and receives the first sub-circuit control signal, a drain electrode of the first control transistor is the first end of the first control sub-circuit and is connected to the control end of the driver circuit, and a source electrode of the first control transistor is the second end of the first control sub-circuit and is connected to the first end of the first sub-circuit, a control electrode of the second control transistor is the third end of the second control sub-circuit and receives the second sub-circuit control signal, a drain electrode of the second control transistor is the first end of the second control sub-circuit and is connected to the third end of the first sub-circuit, and a source electrode of the second control transistor is the second end of the second control sub-circuit and is connected to the third end of the second sub-circuit and the third end of the third sub-circuit.

The third control sub-circuit comprises a third control transistor, a control electrode of the third control transistor is the third end of the third control sub-circuit and receives the third sub-circuit control signal, a drain electrode of the third control transistor is the first end of the third control sub-circuit and is connected to the third end of the fourth sub-circuit, and a source electrode of the third control transistor is the second end of the third control sub-circuit and is connected to the third end of the second sub-circuit and the third end of the third sub-circuit.

The GOA unit further comprises a pull-up circuit, an output end of the pull-up circuit is connected with the driver circuit so as to input a pull-up signal into the driver circuit; and the pull-up signal is configured to drive the driver circuit to be switched on, the driver circuit includes a driving transistor; a control electrode of the driving transistor is the control end of the driver circuit and connected with the output end of the pull-up circuit; a source electrode of the driving transistor receives the first signal; and a drain electrode of the driving transistor is connected with the output end of the GOA unit.

The GOA unit further comprises a reset circuit, the reset circuit is connected with the driver circuit and configured to input a reset voltage signal into the control end of the driver circuit and the output end of the GOA unit; and the reset voltage signal is configured to drive the driver circuit to be switched off and pull down a signal outputted by the GOA unit.

A phase of the first signal is opposite to a phase of the second signal, the pull-up circuit includes a sixth transistor and a first capacitor; a control electrode of the sixth transistor receives the second signal, and a source electrode of the sixth transistor is connected with the pull-up signal; a drain electrode of the sixth transistor is connected with the control electrode of the driving transistor; a first end of the first capacitor is connected between the drain electrode of the sixth transistor and the control electrode of the driving transistor; and a second end of the first capacitor is connected with the output end of the GOA unit.

The reset circuit includes an eighth transistor and a ninth transistor; a control electrode of the eighth transistor is connected with a signal reset end; a source electrode of the eighth transistor is connected with the at least one voltage end to receive the reset voltage signal; a drain electrode of the eighth transistor is connected with the control end of the driver circuit; a control electrode of the ninth transistor is connected with the signal reset end; a source electrode of the ninth transistor is connected with the at least one voltage end to receive the reset voltage signal; and a drain electrode of the ninth transistor is connected with the output end of the GOA unit, and the second signal is outputted from the signal reset end.

Embodiments of the present disclose provides a gate driver circuit, comprising the above-described GOA unit.

Embodiments of the present disclosure further provide a display device, comprising the above-described gate driver circuit.

In the GOA unit provided by the embodiments of the present disclosure, when the GOA unit outputs an off signal, a control end of a driver circuit is connected with at least one low-voltage end through a pull-down circuit. A low-voltage signal is inputted into the control end of the driver circuit from the at least one low-voltage end, so that the driver circuit can keep the off state when the GOA unit outputs the off signal. Hence, a scenario that the driver circuit is switched on by a signal which is coupled in due to signal crosstalk can be avoided. When the signal is coupled in, the GOA unit will maintain the state of outputting the off signal and will not incorrectly output a driving signal as in the existing technologies, so that the incorrect switching-on of one row of pixels corresponding to the GOA unit can be avoided, and hence the row of pixels cannot be charged and display incorrect images, that is, the "abnormal image" phenomenon can be overcome.

The gate driver circuit provided by the embodiments of the present disclosure adopts the GOA unit and can avoid the incorrect switching-on of various rows of pixels corresponding to various stages of GOA units respectively, so that various rows of pixels cannot be charged and display incorrect images, and hence the "abnormal image" phenomenon can be overcome.

The display device provided by the embodiments of the present disclosure adopts the gate driver circuit and can avoid the incorrect switching-on of various rows of pixels corresponding to various stages of GOA units respectively, so that various rows of pixels cannot be charged and display incorrect images, and hence the "abnormal image" phenomenon can be overcome.

BRIEF DESCRIPTION OF THE DRAWINGS

The accompanying drawings are provided for more clear understanding of the present disclosure, are one part of the description, are intended to illustrate the present disclosure together with the following example embodiments, and are not intended to limit the present disclosure. In the accompanying drawings.

DETAILED DESCRIPTION

Detailed description will be given below to the example embodiments of the present disclosure with reference to the accompanying drawings. It should be understood that the example embodiments described here are only intended to illustrate the present disclosure but not intended to limit the present disclosure.

Figure 1:
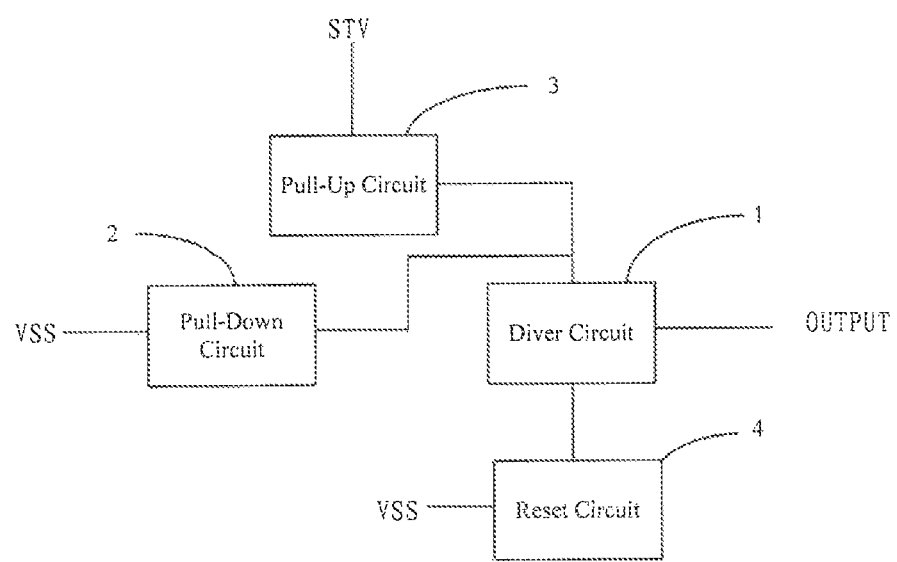
FIG. 1 is a schematic structural view of a GOA unit provided by an embodiment of the present disclosure.

The embodiments of the present disclosure provide a GOA unit. FIG. 1 is a schematic diagram of a GOA unit provided by an embodiment of the present disclosure. As illustrated in FIG. 1, the GOA unit comprises a driver circuit 1 and a pull-down circuit 2. The driver circuit 1 is configured to output a first clock signal CLK from an output end OUTPUT of the GOA unit. The pull-down circuit 2 is connected with the driver circuit 1 and connected with a low-voltage end VSS. The pull-down circuit 2 is configured to input a low-voltage signal provided by the low-voltage end VSS into a control end of the driver circuit 1 when the GOA unit outputs an off signal, so that the driver circuit 1 can be in an off state under the control of the low-voltage signal.

In the embodiment, when the GOA unit outputs the off signal, the pull-down circuit 2 inputs the low-voltage signal provided by the low-voltage end VSS into the control end of the driver circuit 1, so that the driver circuit 1 can maintain the off state when the GOA unit outputs the off signal, and hence the driver circuit 1 cannot be switched on by any signal which is coupled in due to signal crosstalk. Moreover, when the signal is coupled in, the GOA unit will maintain the state of outputting the off signal and will not incorrectly output a driving signal as in the existing technologies, and hence can avoid the incorrect switching-on of one row of pixels corresponding to the GOA unit. Thus, the row of pixels cannot be charged and display incorrect images, and hence the "abnormal image" phenomenon can be overcome.

In addition, the GOA unit further comprises a pull-up circuit 3. An output end of the pull-up circuit 3 is connected with the driver circuit 1 and configured to input a pull-up signal into the driver circuit 1. The pull-up signal pulls up an electric potential of a pull-up node PU (namely a node between the pull-up circuit 3 and the driver circuit 1), so that the driver circuit 1 can be switched on.

In the embodiment, if the GOA unit is disposed on the first row of a gate driver circuit, the pull-up signal is an STV signal, namely a start signal for display. If the GOA unit is disposed on the second row or any subsequent row of the gate driver circuit, the pull-up signal is a signal outputted by an output end OUTPUT of a GOA unit in a previous row.

In addition, the GOA unit further comprises a reset circuit 4. The reset circuit 4 is connected with the driver circuit 1 and configured to input the low-voltage signal into the control end of the driver circuit 1 and the output end OUTPUT of the GOA unit, so that the driver circuit 1 can be switched off and the signal outputted by the GOA unit can be pulled down.

Figure 2:
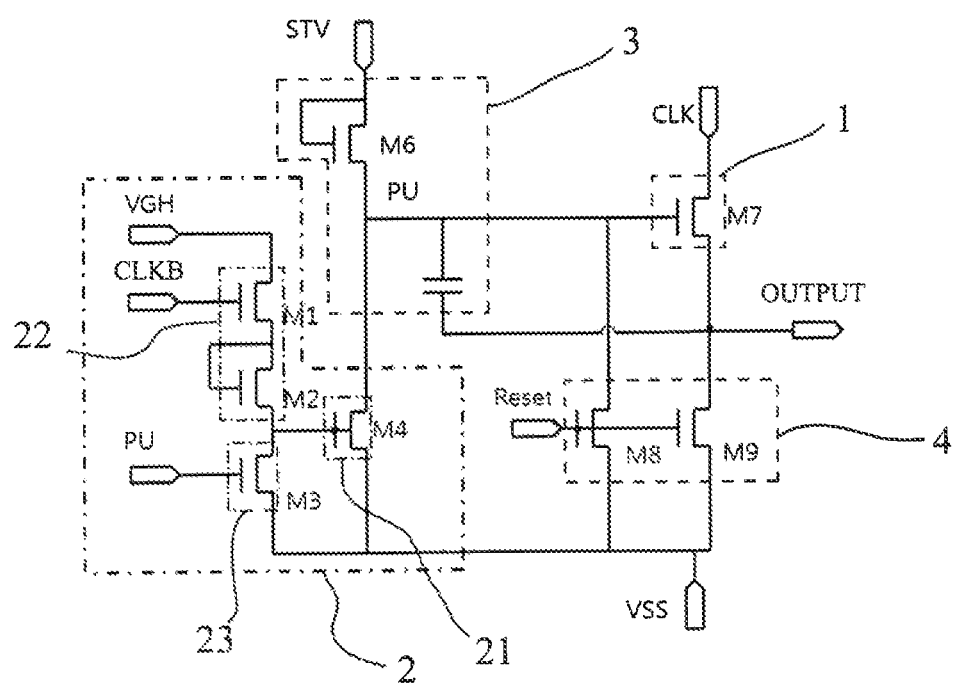
FIG. 2 is a circuit diagram of a GOA unit provided by an embodiment of the present disclosure.
Figure 3:
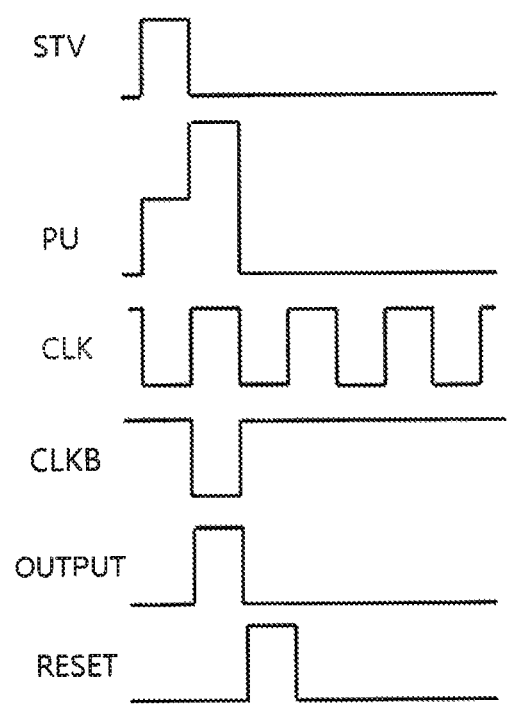
FIG. 3 is a timing sequence diagram of signals in the circuit diagram as shown in FIG. 2.

FIG. 2 is a circuit diagram of a GOA unit provided by an embodiment of the present disclosure, and FIG. 3 is a timing sequence diagram of signals in the circuit diagram as shown in FIG. 2. Description will be given below to the circuit structure of the GOA unit and the working principle of the GOA unit in the embodiment of the present disclosure with reference to FIGS. 2 and 3. It should be noted that thin-film transistors (TFTs) are N-type transistors in FIG. 2. It should be understood that the TFTs may also be P-type transistors.

As illustrated in FIG. 2, the pull-down circuit 2 may include a first sub-circuit 21, a second sub-circuit 22 and a third sub-circuit 23. A first end of the first sub-circuit 21 is connected with a control end of the driver circuit 1; a second end of the first sub-circuit 21 is connected with a low-voltage end VSS; and a third end of the first sub-circuit 21 is connected with the second sub-circuit 22 and the third sub-circuit 23. A first end of the second sub-circuit 22 is connected with a signal input end; a second end of the second sub-circuit 22 is connected with a second clock signal CLKB; and a third end of the second sub-circuit 22 is connected with the third end of the first sub-circuit 21. A first end of the third sub-circuit 23 is connected with the low-voltage end VSS; a second end of the third sub-circuit 23 is connected with the control end of the driver circuit 1; and a third end of the third sub-circuit 23 is connected with the third end of the first sub-circuit 21. In the embodiment, the signal input end may be a high-voltage end VGH, or the second clock signal CLKB may be inputted from the signal input end.

Specifically, as illustrated in FIG. 2, the first sub-circuit 21 may include a fourth transistor M4. A control electrode of the fourth transistor M4 is the third end of the first sub-circuit 21 and connected with the second sub-circuit 22 and the third sub-circuit 23; a source electrode of the fourth transistor M4 is the second end of the first sub-circuit 21 and connected with the low-voltage end VSS; and a drain electrode of the fourth transistor M4 is the first end of the first sub-circuit 21 and connected with the control end of the driver circuit 1.

The second sub-circuit 22 may include a first transistor M1 and a second transistor M2. A control electrode of the first transistor M1 is the second end of the second sub-circuit 22 and connected with the second clock signal CLKB; a source electrode of the first transistor M1 is the first end of the second sub-circuit 22 and connected with the signal input end (namely the high-voltage end VGH); and a drain electrode of the first transistor M1 is connected with a control electrode and a source electrode of the second transistor M2. A drain electrode of the second transistor M2 is the third end of the second sub-circuit 22 and connected with the third end of the first sub-circuit 21.

The third sub-circuit 23 may include a third transistor M3. A control electrode of the third transistor M3 is the second end of the third sub-circuit 23 and connected with the control end of the driver circuit 1; a source electrode of the third transistor M3 is the first end of the third sub-circuit 23 and connected with the low-voltage end VSS; and a drain electrode of the third transistor M3 is the third end of the third sub-circuit 23 and connected with the third end of the first sub-circuit 21.

The driver circuit 1 may include a driving transistor M7. A control electrode of the driving transistor M7 is the control end of the driver circuit 1 and connected with an output end of the pull-up circuit 3; a source electrode of the driving transistor M7 is connected with the first clock signal CLK; and a drain electrode of the driving transistor M7 is connected with the output end OUTPUT of the GOA unit.

The pull-up circuit 3 may include a sixth transistor M6 and a first capacitor C1. A control electrode and a source electrode of the sixth transistor M6 are connected with a pull-up signal, and a drain electrode of the sixth transistor M6 is connected with the control electrode of the driving transistor M7. A first end of the first capacitor C1 is connected between the drain electrode of the sixth transistor M6 and the control electrode of the driving transistor M7, and a second end of the first capacitor C1 is connected with the output end OUTPUT of the GOA unit.

The reset circuit 4 may include an eighth transistor M8 and a ninth transistor M9. A control electrode of the eighth transistor M8 is connected with a signal reset end Reset; a source electrode of the eighth transistor M8 is connected with the low-voltage end VSS; and a drain electrode of the eighth transistor M8 is connected with the control electrode of the driving transistor M7. A control electrode of the ninth transistor M9 is connected with the signal reset end Reset; a source electrode of the ninth transistor M9 is connected with the low-voltage end VSS; and a drain electrode of the ninth transistor M9 is connected with the output end OUTPUT of the GOA unit.

An operating process of elements in the GOA unit provided by the embodiments of the present disclosure may include a first period, a second period, a third period and a fourth period.

In the first period, the second clock signal CLKB is in a high level, so that the first transistor M1 and the second transistor M2 can be switched on. The reset signal Reset is in a low level, so that the eighth transistor M8 and the ninth transistor M9 can be switched off. The pull-up signal (which is an STV signal here and indicates that the GOA unit is disposed on the first row of the gate driver circuit) is in a high level and configured to pull up the electric potential of the pull-up node PU. In this case, the first end of the first capacitor C1 is charged, so that the driving transistor M7 is switched on, and hence the first clock signal CLK is outputted from the output end OUTPUT through the driving transistor M7 and inputted into the second end of the first capacitor. And meanwhile, the third transistor M3 is switched on, so that the control electrode of the fourth transistor M4 is connected with the low-voltage end VSS, and hence the fourth transistor M4 is switched off in the first period.

In the second period, the STV signal is changed to a low level, so that the sixth transistor M6 is switched off, and hence the pull-up node PU maintains a high level and is in the flooding state, the first clock signal CLK is changed from the low level to the high level, so that the output end OUTPUT of the GOA unit outputs a high level signal. Meanwhile, the second end of the first capacitor C1 is charged so that the first capacitor C1 is subjected to bootstrapping, and hence the electric potential of the pull-up node PU can be further increased.

In the third period, the reset signal Reset is changed to from a low level to a high level, so that the eighth transistor M8 and the ninth transistor M9 can be switched on, and hence the pull-up node PU is connected with the low-voltage end VSS and the output end OUTPUT of the GOA unit is also connected with the low-voltage end VSS. In this case, the driving transistor M7 is switched off and the GOA unit outputs the off signal.

In the fourth period, the second clock signal CLKB is in high level, so that the first transistor M1 and the second transistor M2 can be switched on, and hence the electric potential of the control electrode of the fourth transistor M4 is in high level and the fourth transistor M4 is switched on.

In this case, the low-voltage end VSS is connected with the control electrode of the driving transistor M7 through the fourth transistor M4, so that the driving transistor M7 can keep the off state in this period and cannot be incorrectly switched on by a signal which is coupled into the GOA unit. Hence, the GOA does not output incorrect driving signals. Thus, one row of pixels corresponding to the GOA unit cannot be incorrectly switched on and display incorrect images.

Description is given above to the structure of the GOA unit and the working principle of the GOA unit in each cycle period of the GOA unit with reference to the accompanying drawings. As seen from the description, when the GOA unit outputs the off signal, a scenario that the GOA unit is incorrectly switched on and incorrectly outputs a driving signal can be avoided, and hence display errors on the display device can be prevented.

In the embodiments of the present disclosure, the circuit structure of the GOA unit is not limited to the structure as shown in FIG. 2.

Figure 4:
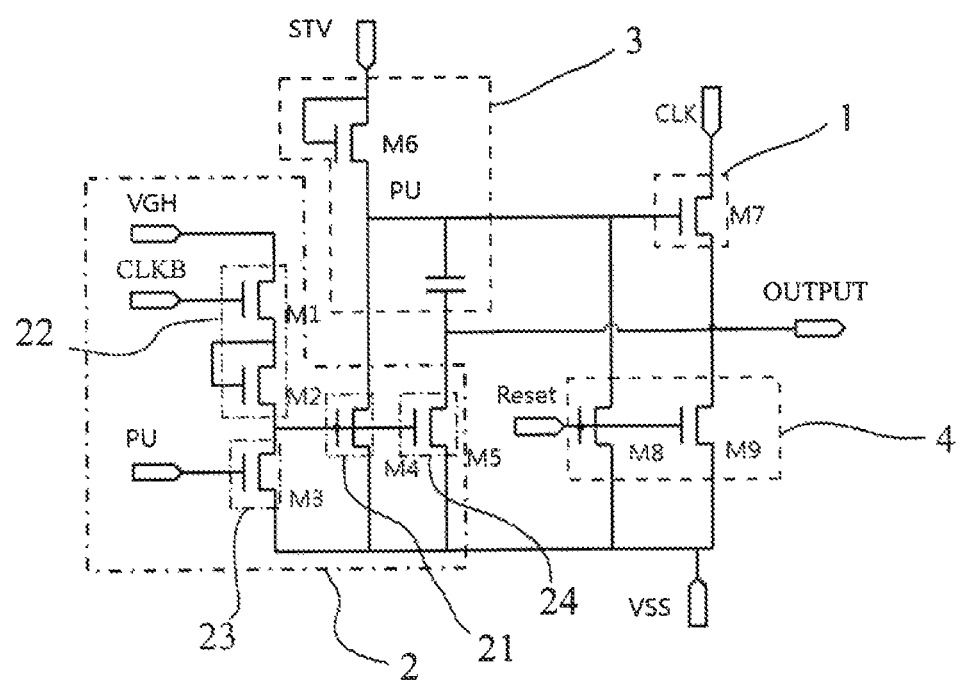
FIG. 4 is a circuit diagram of a GOA unit provided by an embodiment of the present disclosure.

FIG. 4 is a circuit diagram of the GOA unit provided by an embodiment of the present disclosure. Specifically, as illustrated in FIG. 4, the pull-down unit 2 further includes a fourth sub-circuit 24. A first end of the fourth sub-circuit 24 is connected with the output end OUTPUT of the GOA unit; a second end of the fourth sub-circuit 24 is connected with the low-voltage end VSS; and a third end of the fourth sub-circuit 24 is connected with the third end of the second sub-circuit 22 and the third end of the third sub-circuit 23. More specifically, the fourth sub-circuit 24 may include a fifth transistor M5. A control electrode of the fifth transistor M5 is the third end of the fourth sub-circuit 24 and connected with the drain electrode of the second transistor M2 in the second sub-circuit 22 and the drain electrode of the third transistor M3 in the third sub-circuit 23; a source electrode of the fifth transistor M5 is the second end of the fourth sub-circuit 24 and connected with the low-voltage end VSS; and a drain electrode of the fifth transistor M5 is the first end of the fourth sub-circuit 24 and connected with the output end OUTPUT of the GOA unit. In the embodiment, when the GOA unit outputs the off signal, both the second end of the first capacitor C1 and the output end OUTPUT are connected with the low-voltage end VSS, so that the signal outputted from the output end OUTPUT of the GOA unit is further guaranteed to be an off signal, and hence the adverse effect of the signal which is coupled into the GOA unit can be maximally reduced on the GOA unit.

In the embodiment as shown in FIG. 4, the low-voltage ends connected with the third transistor M3, the fourth transistor M4 and the fifth transistor M5 are the same low-voltage end so as to reduce the number of power ports needed to be arranged. In addition, the low-voltage end connected with the pull-down circuit 2 and the low-voltage end connected with the reset circuit 4 have the same voltage so as to reduce the number of the power ports needed to be arranged.

Figure 5:
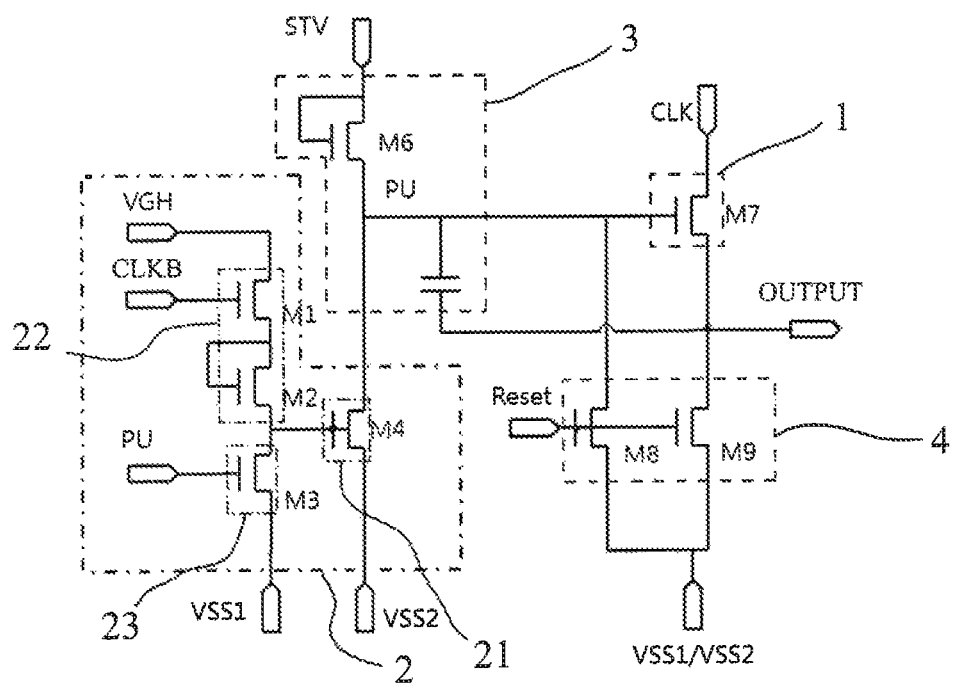
FIG. 5 is a circuit diagram of a GOA unit provided by an embodiment of the present disclosure.
Figure 6:
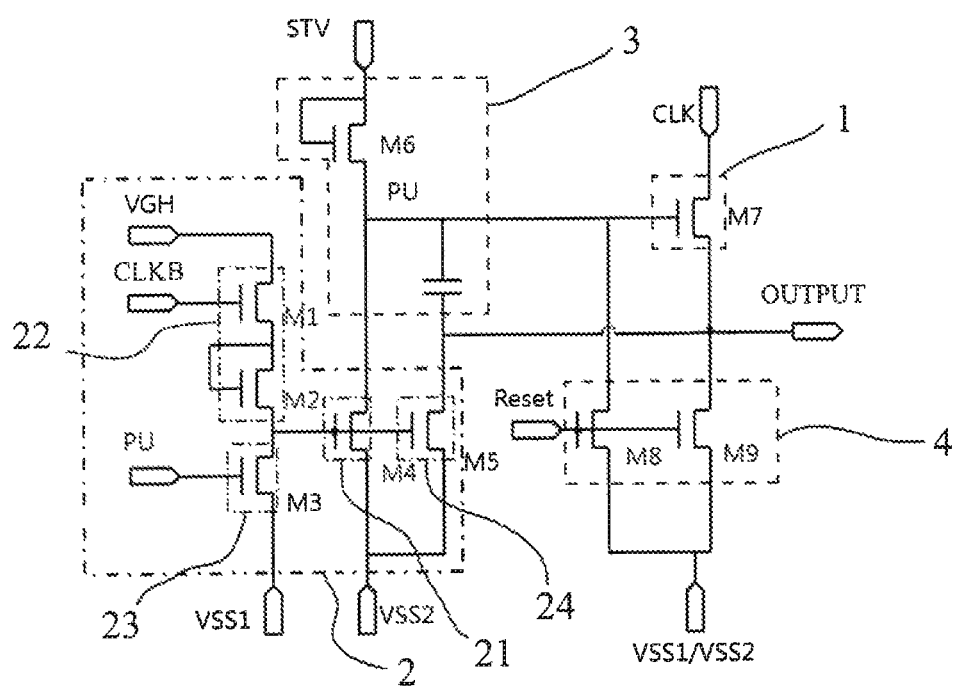
FIG. 6 is a circuit diagram of a GOA unit provided by an embodiment of the present disclosure.

In other embodiments of the present disclosure, the pull-down circuit 2 may also be connected with a plurality of low-voltage ends. For instance, as illustrated in FIG. 5, the source electrode of the third transistor M3 is connected with a first low-voltage end VSS1, and the source electrode of the fourth transistor M4 is connected with a second low-voltage end VSS2. In addition, as illustrated in FIG. 6, the source electrode of the third transistor M3 is connected with the first low-voltage end VSS1, and both the source electrode of the fourth transistor M4 and the source electrode of the fifth transistor M5 are connected with the second low-voltage end VSS2. It should be understood that: as for the embodiment as shown in FIG. 6, the low-voltage end connected with the source electrode of the fourth transistor M4 and the low-voltage end connected with the source electrode of the fifth transistor M5 may also be different low-voltage ends. When the GOA unit outputs the off signal, a low-voltage signal is inputted into the control electrode of the driving transistor M7 from the low-voltage end connected with the source electrode of the fourth transistor M4.

In addition, the low-voltage end connected with the pull-down circuit 2 and the low-voltage end connected with the reset circuit 4 may be different low-voltage ends, as long as the low-voltage signals outputted by the low-voltage ends that are connected with the pull-down circuit 2 or the reset circuit 4 can drive the driving transistor M7 to be switched off.

In the embodiments of the present disclosure, a voltage inputted from the signal input end may be equal to a turn-on voltage of the gate driver circuit. For instance, a voltage outputted from the high-voltage end VGH may be equal to the turn-on voltage of the gate driver circuit. In this case, by direct utilization of the existing high voltage in the gate driver circuit, the number of the power ports can be reduced, and hence the circuit structure can be simplified.

In addition, it should be noted that: in the embodiments of the present disclosure, a signal waveform of the second clock signal CLKB is not limited to the waveform as shown in FIG. 3, as long as the voltage of the control electrode of the fourth transistor M4 is in low level when the pull-up node PU is in high level (as for an embodiment in which the pull-down circuit 2 includes the fifth transistor M5, the voltage of the control electrode of the fifth transistor M5 may also need to be pulled down to low level).

In the GOA unit provided by the embodiments of the present disclosure, when the GOA unit outputs the off signal, the pull-down circuit 2 allows the control end of the driver circuit 1 to be connected with the low-voltage end VSS, and the low-voltage signal is inputted into the control end of the driver circuit 1 from the low-voltage end VSS. Thus, the driver circuit 1 can keep the off state when the GOA unit outputs the off signal, and hence a scenario that the driver circuit 1 is switched on by a signal which is coupled into the GOA unit due to signal crosstalk can be avoided. Moreover, even if the signal is coupled into the GOA unit, the GOA unit may also maintain the state of outputting the off signal and may not incorrectly output the driving signal as in the existing technologies, so that the incorrect switching-on of one row of pixels corresponding to the GOA unit can be avoided. Thus, the row of pixels cannot be charged and display incorrect images, and hence the "abnormal image" phenomenon can be overcome.

It should be noted that, the transistors may be classified into N-type transistors and P-type transistors according to the characteristics of the transistors. In the above embodiments of the present disclosure, the embodiments of the present disclosure illustrate the technical solution of the present disclosure in detail by taking the transistors in the GOA unit as N-type transistors as an example. However the transistors in the embodiments of the present disclosure are not limited to the N-type transistors, and one of ordinary skill in the art also can use the P-type transistors to implement one or more of the transistors in the embodiments of the present disclosure according to actual needs. These transistors are, for example, thin film transistors. In addition, in the embodiments of the present disclosure, the phrases "connect", "connected", etc., are not intended to define a physical connection or mechanical connection, but may include an electrical connection, directly or indirectly.

Figure 7:
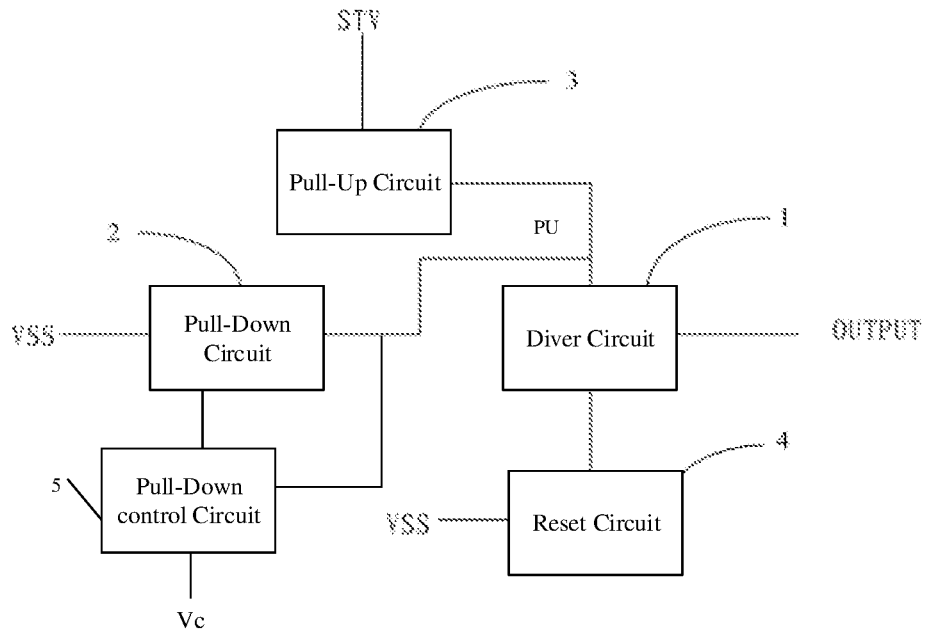
FIG. 7 is a schematic block diagram of a GOA unit provided by an embodiment of the present disclosure.

An embodiment of the present disclosure further provides a gate on array (GOA) unit. FIG. 7 is a schematic block diagram of a GOA unit provided by an embodiment of the present disclosure.

As shown in FIG. 7, the GOA unit comprises: a driver circuit 2, a pull-down circuit 2, and a pull-down control circuit 5. The driver circuit 1 is configured to output a first signal CLK from an output end OUTPUT of the GOA unit. The pull-down circuit 2 is connected with the driver circuit 1 and connected with at least one voltage end VSS, for example, the pull-down circuit 2 is connected with the driver circuit 1 through the pull-down control circuit 5. The pull-down circuit 2 is configured to input a voltage signal provided by the voltage end VSS into a control end of the driver circuit 1 when the GOA unit outputs an off signal, so that the driver circuit 1 can be in an off state under the control of the voltage signal. The pull-down control circuit 5 is connected with the pull-down circuit 2 and the driver circuit 1, and is configured to control the pull-down circuit 2 to input the voltage signal to the control end of the driver circuit 1.

For example, in some embodiments, the first signal CLK may be a clock signal, such as a first clock signal described above; in some other embodiments, the first signal CLK may also be a voltage signal, such as, a high voltage signal or a low voltage signal. For example, the first signal CLK may be provided by a first signal line, in some examples, the first signal line may also provide the high voltage signal or the low voltage signal.

For example, as shown in FIG. 7, the GOA unit further comprises a pull-up circuit 3. An output end of the pull-up circuit 3 is connected with the driver circuit 1 and configured to input a pull-up signal into the driver circuit 1. The pull-up signal pulls up an electric potential of a pull-up node PU (namely a node between the pull-up circuit 3 and the driver circuit 1), so that the driver circuit 1 can be switched on.

For example, as shown in FIG. 7, the GOA unit further comprises a reset circuit 4. The reset circuit 4 is connected with the driver circuit 1 and configured to input a reset voltage signal into the control end of the driver circuit 1 and the output end OUTPUT of the GOA unit, so that the driver circuit 1 can be switched off and the signal outputted by the GOA unit can be pulled down.

Figure 8:
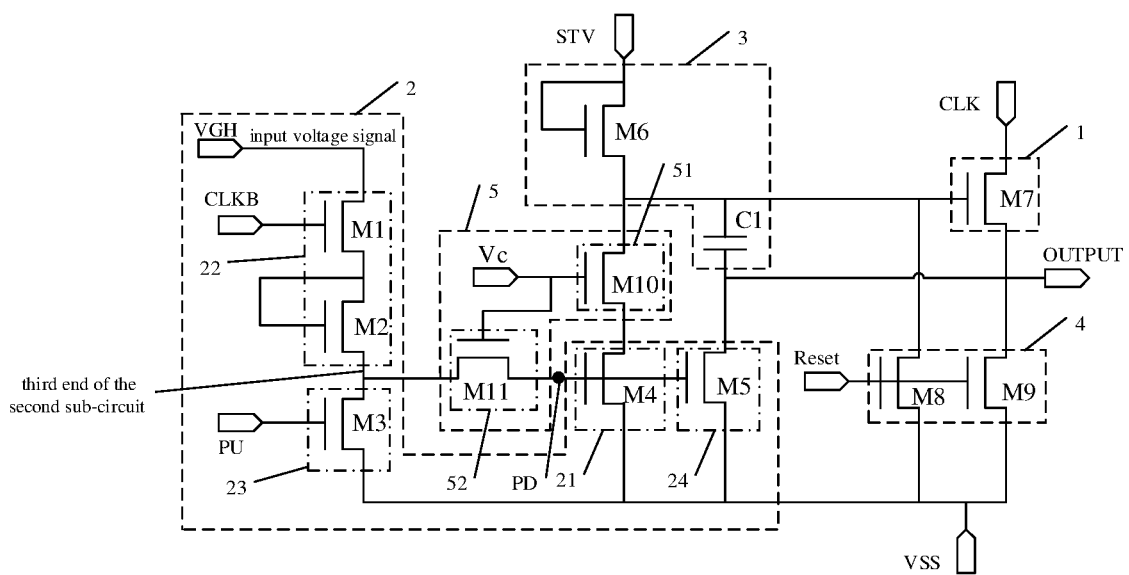
FIG. 8 is a circuit schematic diagram of a GOA unit provided by an embodiment of the present disclosure.

It should be noted that, in the embodiment shown in FIG. 8, the GOA unit is implemented by using N-type transistors, in this case, the at least one voltage end VSS is a low-voltage end, the voltage signal provided by the at least one voltage end VSS is a low-voltage signal, and the reset voltage signal is a low-voltage signal.

FIG. 8 is a circuit schematic diagram of a GOA unit provided by an embodiment of the present disclosure.

For example, as shown in FIG. 8, the pull-down circuit 2 may include a first sub-circuit 21, a second sub-circuit 22 and a third sub-circuit 23. A first end of the first sub-circuit 21 is connected with a control end of the driver circuit 1, for example, the first end of the first sub-circuit 21 is connected with the control end of the driver circuit 1 through the pull-down control circuit 5; a second end of the first sub-circuit 21 is connected with the at least one voltage end VSS; and a third end of the first sub-circuit 21 is connected with the second sub-circuit 22 and the third sub-circuit 23, for example, the third end of the first sub-circuit 21 is connected with the second sub-circuit 22 and the third sub-circuit 23 through the pull-down control circuit 5. A first end of the second sub-circuit 22 is connected with a signal input end; a second end of the second sub-circuit 22 is connected with a second signal CLKB; and a third end of the second sub-circuit 22 is connected with the third end of the first sub-circuit 21, for example, the third end of the second sub-circuit 22 is connected with the third end of the first sub-circuit 21 through the pull-down control circuit 5. A first end of the third sub-circuit 23 is connected with the at least one voltage end VSS; a second end of the third sub-circuit 23 is connected with the control end of the driver circuit 1; and a third end of the third sub-circuit 23 is connected with the third end of the first sub-circuit 21, for example, the third end of the third sub-circuit 23 is connected with the third end of the first sub-circuit 21 through the pull-down control circuit 5. That is, the first end of the first sub-circuit 21 and the third end of the first sub-circuit 21 are directly connected to the pull-down control circuit 5, the pull-down control circuit 5 is directly connected to the control end of the driver circuit 1, and the pull-down control circuit 5 is directly connected to the third end of the second sub-circuit 22 and the third end of the third sub-circuit 23.

For example, in some embodiments, the second signal CLKB may also be a clock signal, such as a second clock signal described above; in some other embodiments, the second signal CLKB may also be a voltage signal, such as, a high voltage signal or a low voltage signal. For example, the second signal CLKB may be provided by a second signal line, in some examples, the second signal line may also provide the high voltage signal or the low voltage signal.

For example, in some embodiments, a phase of the first signal CLK and a phase of the second signal CLKB are opposite to each other.

For example, as shown in FIG. 8, the pull-down control circuit 5 comprises a first control sub-circuit 51 and a second control sub-circuit 52. A first end of the first control sub-circuit 51 is connected with the control end of the driver circuit 1, a second end of the first control sub-circuit 51 is connected with the first end of the first sub-circuit 21, and a third end of the first control sub-circuit 51 receives a first sub-circuit control signal. A first end of the second control sub-circuit 52 is connected with a pull-down control node PD, and the third end of the first sub-circuit 21 is also connected with the pull-down control node PD, that is, the first end of the second control sub-circuit 52 is connected with the third end of the first sub-circuit 21, a second end of the second control sub-circuit 52 is connected with the third end of the second sub-circuit 22 and the third end of the third sub-circuit 23, and a third end of the second control sub-circuit 52 receives a second sub-circuit control signal.

For example, in some embodiments, the first sub-circuit control signal and the second sub-circuit control signal may be the same, as shown in FIG. 8, the third end of the first control sub-circuit 51 and the third end of the second control sub-circuit 52 may be connected to the same control voltage end Vc to receive the same signal, that is, a voltage signal outputted by the control voltage end Vc can be used as the first sub-circuit control signal and the second sub-circuit control signal.

For example, a polarity of a voltage output by a voltage end connected to the first end of the third sub-circuit 23 is opposite to a polarity of the first sub-circuit control signal, thereby ensuring that a phase of the voltage of the pull-up node PU and a phase of the voltage of the pull-down control node PD are opposite to each other when the GOA unit operates. It should be noted that, when the GOA unit outputs an on signal, a polarity of the voltage outputted by the voltage end connected to the first end of the third sub-circuit 23 is opposite to a polarity of the first sub-circuit control signal; or, when the driver circuit 1 of the GOA unit is switched on, the polarity of the voltage outputted by the voltage end connected to the first end of the third sub-circuit 23 is opposite to the polarity of the first sub-circuit control signal. In the embodiments of the present disclosure, "polarities of two signals being opposite" may indicate that: a value of one signal is positive, and a value of the other signal is negative. For example, in some embodiments, the voltage end connected to the first end of the third sub-circuit 23 is a low-voltage end to output a low level signal, and the first sub-circuit control signal is a high level signal, that is, the control voltage end Vc is a high-voltage end to output a high level signal. For another example, in some other embodiments, the voltage end connected to the first end of the third sub-circuit 23 is configured to output a second signal, the first sub-circuit control signal is the first signal, that is, the first end of the third sub-circuit 23 receives the second signal CLKB, and the third end of the first control sub-circuit 51 receives the first signal CLK.

It should be noted that, one of the voltage output by the voltage end connected to the first end of the third sub-circuit 23 and the first sub-circuit control signal may be a clock signal, and the other of the voltage output by the voltage end connected to the first end of the third sub-circuit 23 and the first sub-circuit control signal may be a low-voltage signal.

For example, as shown in FIG. 8, the first sub-circuit 21 may include a fourth transistor M4. A control electrode of the fourth transistor M4 is the third end of the first sub-circuit 21 and connected with the second sub-circuit 22 and the third sub-circuit 23; a source electrode of the fourth transistor M4 is the second end of the first sub-circuit 21 and connected with the voltage end VSS; and a drain electrode of the fourth transistor M4 is the first end of the first sub-circuit 21 and connected with the control end of the driver circuit 1 through the pull-down control circuit 5. For example, the drain electrode of the fourth transistor M4 is directly connected to the second end of the first control sub-circuit 51, and the first end of the first control sub-circuit 51 is directly connected to the control end of the driver circuit 1.

For example, as shown in FIG. 8, in some embodiments, the second sub-circuit 22 may include a first transistor M1 and a second transistor M2. A control electrode of the first transistor M1 is the second end of the second sub-circuit 22 and connected with the second signal CLKB; a source electrode of the first transistor M1 is the first end of the second sub-circuit 22 and connected with the signal input end (namely the high-voltage end VGH); and a drain electrode of the first transistor M1 is connected with a control electrode and a source electrode of the second transistor M2. A drain electrode of the second transistor M2 is the third end of the second sub-circuit 22 and connected with the third end of the first sub-circuit 21 (namely, the control electrode of the fourth transistor M4) through the pull-down control circuit 5.

For example, in some other embodiments, the second sub-circuit 22 may include a first transistor M1 and a second transistor M2. The second end of the second sub-circuit 22 comprises a control electrode of the first transistor M1 and a control electrode of the second transistor M2. The control electrode of the first transistor M1 receives the second signal CLKB; a source electrode of the first transistor M1 is the first end of the second sub-circuit 22 and connected with the signal input end (namely the high-voltage end VGH); a drain electrode of the first transistor M1 is connected with a source electrode of the second transistor M2; the control electrode of the second transistor M2 receives the second signal CLKB, a drain electrode of the second transistor M2 is the third end of the second sub-circuit 22 (namely, the control electrode of the fourth transistor M4) and connected with the third end of the first sub-circuit 21. For example, the drain electrode of the second transistor M2 is directly connected to the second end of the second control sub-circuit 52, and the first end of the second control sub-circuit 52 is directly connected to the control electrode of the fourth transistor M4.

For example, in some embodiments, as shown in FIG. 8, the signal input end may be the high-voltage end VGH, or, the second signal CLKB may be inputted from the signal input end, in this case, the source electrode and the control electrode of the first transistor M1 are connected to each other and receive the second signal CLKB.

For example, as shown in FIG. 8, the third sub-circuit 23 may include a third transistor M3. A control electrode of the third transistor M3 is the second end of the third sub-circuit 23 and connected with the control end of the driver circuit 1; a source electrode of the third transistor M3 is the first end of the third sub-circuit 23 and connected with the voltage end VSS; and a drain electrode of the third transistor M3 is the third end of the third sub-circuit 23 and connected with the third end of the first sub-circuit 21 (that is, the control electrode of the fourth transistor M4) through the pull-down control circuit 5. For example, the drain electrode of the third transistor M3 is directly connected to the second end of the second control sub-circuit 52.

For example, as shown in FIG. 8, the voltage end connected to the source electrode of the third transistor M3 and the voltage end connected to the source electrode of the fourth transistor M4 are the same voltage end, so as to reduce the number of power ports needed to be arranged.

For example, as shown in FIG. 8, the first control sub-circuit 51 comprises a first control transistor M10, and the second control sub-circuit 52 comprises a second control transistor M11. A control electrode of the first control transistor M10 is the third end of the first control sub-circuit 51 and receives the first sub-circuit control signal, a drain electrode of the first control transistor M10 is the first end of the first control sub-circuit 51 and is connected to the control end of the driver circuit 1, and a source electrode of the first control transistor M10 is the second end of the first control sub-circuit 51 and is connected to the first end of the first sub-circuit 21, that is, the source electrode of the first control transistor M10 is connected to the drain electrode of the fourth transistor M4. A control electrode of the second control transistor M11 is the third end of the second control sub-circuit 52 and receives the second sub-circuit control signal, a drain electrode of the second control transistor M11 is the first end of the second control sub-circuit 52 and is connected to the third end of the first sub-circuit 21, and a source electrode of the second control transistor M11 is the second end of the second control sub-circuit 52 and is connected to the third end of the second sub-circuit 22 and the third end of the third sub-circuit 23. That is, the source electrode of the second control transistor M11 is connected to the drain electrode of the second transistor M2 and the drain electrode of the third transistor M3.

It should be noted that, in some embodiments, the second sub-circuit 22 may include only one of the first transistor M1 and the second transistor M2, or the control electrode of the first transistor M1 and the control electrode of the second transistor M2 are the same. The pull-down control circuit 5 may only comprise one of the first control sub-circuit 51 and the second control sub-circuit 52, that is, the pull-down control circuit 5 only comprises the first control transistor M10 or the second control transistor M11. Some or all of the transistors in the present disclosure may be thin film transistors, such as double-gate thin film transistors.

For example, under control of the second control transistor M11, the control electrode of the fourth transistor M4 can be selectively connected to the drain electrode of the second transistor M2 and the drain electrode of the third transistor M3, thereby preventing the voltage of the drain electrode of the second transistor M2 and/or the drain electrode of the third transistor M3 from erroneously turning on the fourth transistor M4.

For example, the driver circuit 1 may include a driving transistor M7. A control electrode of the driving transistor M7 is the control end of the driver circuit 1 and connected with an output end of the pull-up circuit 3; a source electrode of the driving transistor M7 is configured to receive the first signal CLK; and a drain electrode of the driving transistor M7 is connected with the output end OUTPUT of the GOA unit.

For example, in some embodiments, as shown in FIG. 8, the pull-up circuit 3 may include a sixth transistor M6 and a first capacitor C1. A control electrode and a source electrode of the sixth transistor M6 are configured to receive a pull-up signal STV, and a drain electrode of the sixth transistor M6 is connected with the control electrode of the driving transistor M7. A first end of the first capacitor C1 is connected between the drain electrode of the sixth transistor M6 and the control electrode of the driving transistor M7, and a second end of the first capacitor C1 is connected with the output end OUTPUT of the GOA unit. It should be noted that, the pull-up signal STV may be a separately provided signal, if a plurality of GOA units are cascaded, each of the plurality of GOA units is the GOA unit described in the present disclosure, in this case, a pull-up signal STV of a current GOA unit may also be an output signal of a previous-stage GOA unit of the current GOA unit and a previous-several-stage GOA unit of the current GOA unit.

Figure 12A:
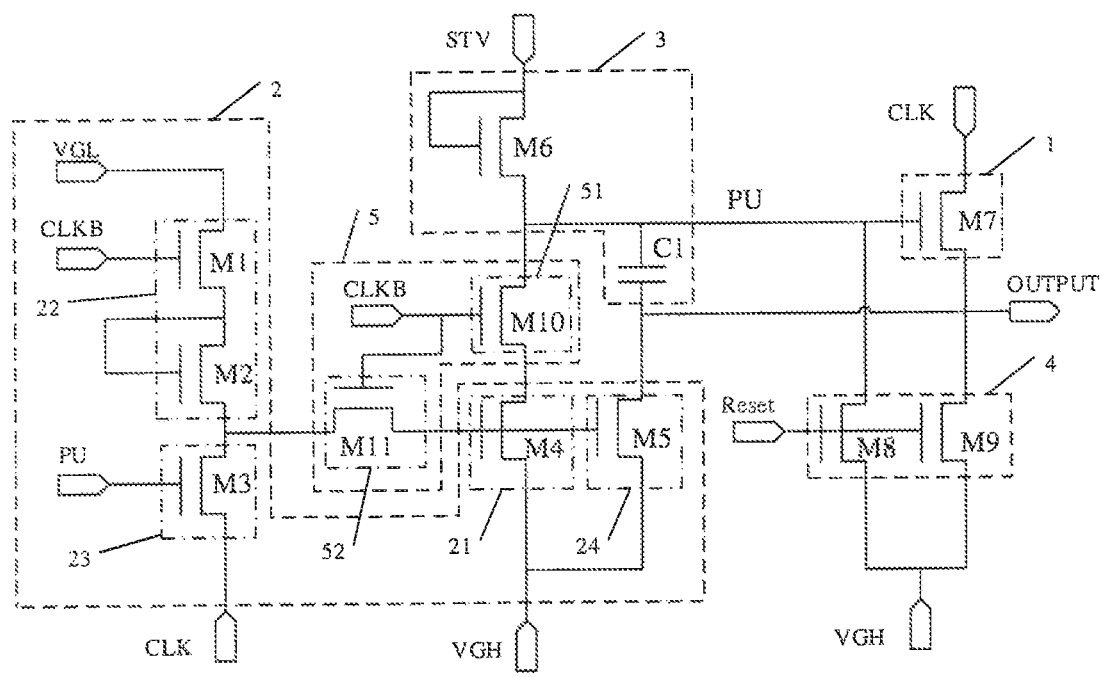
FIG. 12A is a circuit schematic diagram of a GOA unit provided by still another embodiment of the present disclosure.
Figure 12B:
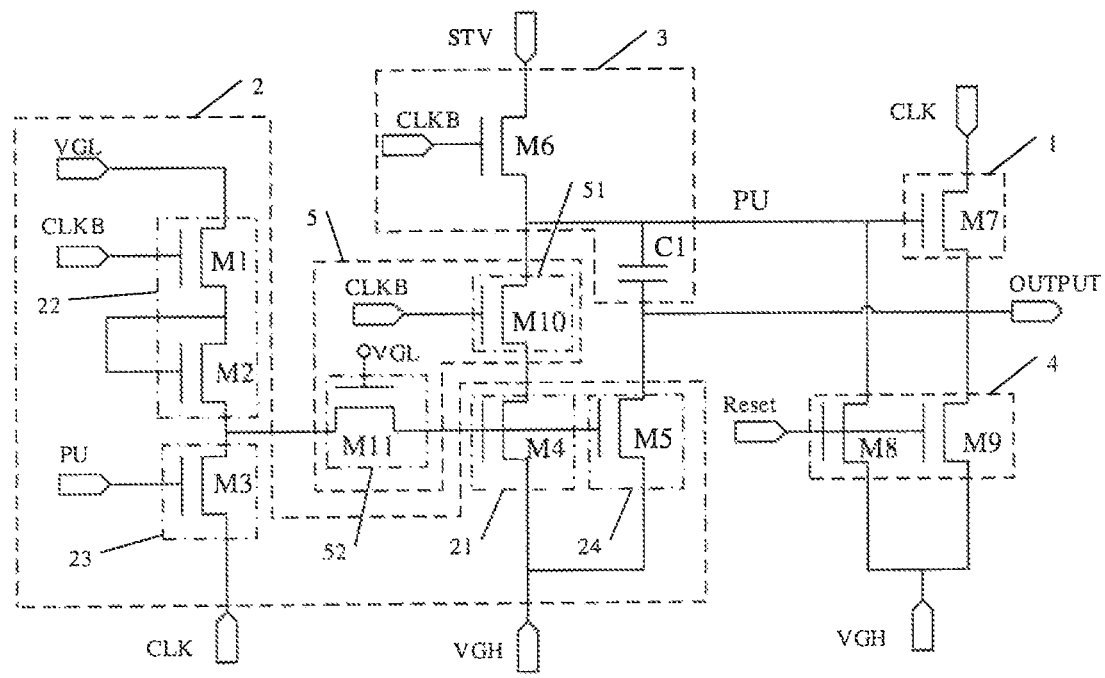
FIG. 12B is a circuit schematic diagram of another GOA unit provided by still another embodiment of the present disclosure.

For example, in some other embodiments, the pull-up circuit 3 may include a sixth transistor M6 and a first capacitor C1. A control electrode of the sixth transistor M6 is configured to receive a clock signal, such as the second signal CLKB (as shown in FIG. 12A and FIG. 12B to be described below), a source electrode of the sixth transistor M6 is configured to receive a pull-up signal STV, and a drain electrode of the sixth transistor M6 is connected with the control electrode of the driving transistor M7. A first end of the first capacitor C1 is connected between the drain electrode of the sixth transistor M6 and the control electrode of the driving transistor M7, and a second end of the first capacitor C1 is connected with the output end OUTPUT of the GOA unit. It should be noted that, in some embodiments, the pull-up circuit 3 may include a sixth transistor M6.

For example, as shown in FIG. 8, the reset circuit 4 may include an eighth transistor M8 and a ninth transistor M9. A control electrode of the eighth transistor M8 is connected with a signal reset end Reset; a source electrode of the eighth transistor M8 is connected with the voltage end VSS; and a drain electrode of the eighth transistor M8 is connected with the control end of the driver circuit 1, that is, the drain electrode of the eighth transistor M8 is connected with the control electrode of the driving transistor M7. A control electrode of the ninth transistor M9 is connected with the signal reset end Reset; a source electrode of the ninth transistor M9 is connected with the voltage end VSS; and a drain electrode of the ninth transistor M9 is connected with the output end OUTPUT of the GOA unit. It should be noted that, the source electrode of the eighth transistor M8 and the source electrode of the ninth transistor M9 may also be connected to other signal end or may receive other signal, such as the first signal CLK.

For example, in some embodiments, the second signal CLKB is outputted from the signal reset end Reset, that is, the control electrode of the eighth transistor M8 and the control electrode of the ninth transistor M9 both receive the second signal CLKB. It should be noted that, in some embodiments, the control electrode of the eighth transistor M8 and the control electrode of the ninth transistor M9 receive different signals, such as the control electrode of the eighth transistor M8 receives the first signal CLK, the control electrode of the ninth transistor M9 both receive receives the second signal CLKB.

Figure 9:
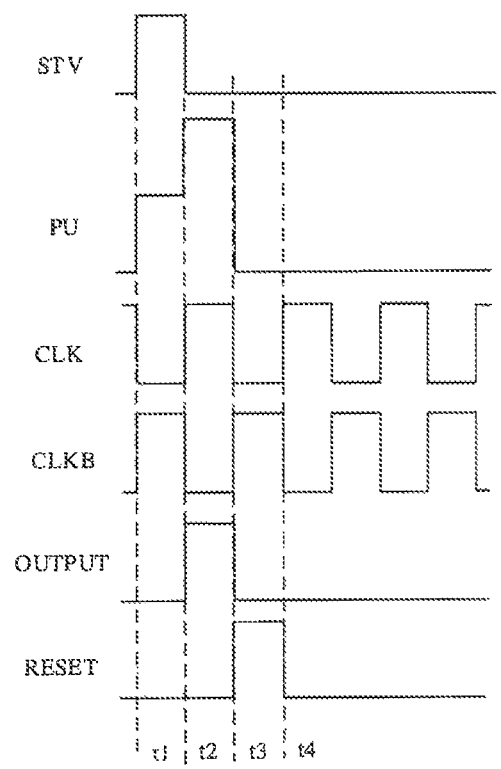
FIG. 9 is a timing sequence diagram of signals in a GOA unit provided by an embodiment of the present disclosure.

FIG. 9 is a timing sequence diagram of signals in a GOA unit provided by an embodiment of the present disclosure. As shown in FIG. 9, taking the GOA unit shown in FIG. 8 as an example, an operating process of elements in the GOA unit provided by the embodiments of the present disclosure may include a first period t1, a second period t2, a third period t3, and a fourth period t4.

In the first period t1 to the fourth period t4, the control voltage end Vc provides a high level signal, that is, the first sub-circuit control signal is a high level signal, so that the first control transistor M10 and the second control transistor M11 are turned on.

In the first period t1, the second signal CLKB is a high level signal, so that the first transistor M1 and the second transistor M2 can be turned on. A signal outputted by the signal reset end Reset is a low level signal, so that the eighth transistor M8 and the ninth transistor M9 can be turned off. The pull-up signal (which is an STV signal here and indicates that the GOA unit is disposed on the first row of the gate driver circuit) is a high level signal, the sixth transistor M6 is turned on. In this case, the first end of the first capacitor C1 is charged, so that the driving transistor M7 is turned on, and hence the first signal CLK is outputted from the output end OUTPUT through the driving transistor M7 and inputted into the second end of the first capacitor C1. And meanwhile, because the signal of the pull-up node PU is a high level signal (that is, the pull-up signal), the third transistor M3 is turned on, in addition, the second control transistor M11 is also turned on, so that the control electrode of the fourth transistor M4 is connected with the voltage end VSS, and hence the fourth transistor M4 is turned off in the first period t1.

In the second period t2, the STV signal becomes a low level signal, so that the sixth transistor M6 is turned off, and hence the pull-up node PU maintains a high level and is in the flooding state, the first signal CLK is changed from the low level signal to the high level signal, so that the output end OUTPUT of the GOA unit outputs a high level signal. Meanwhile, the second end of the first capacitor C1 is charged so that the first capacitor C1 is subjected to bootstrapping, and hence the electric potential of the pull-up node PU can be further increased.

In the third period t3, the signal outputted by the signal reset end Reset changes from a low level signal to a high level signal, so that the eighth transistor M8 and the ninth transistor M9 can be turned on, and hence the pull-up node PU is connected with the voltage end VSS and the output end OUTPUT of the GOA unit is also connected with the voltage end VSS. In this case, the driving transistor M7 is turned off and the GOA unit outputs the off signal.

In the third period t3, the second signal CLKB is a high level signal, so that the first transistor M1 and the second transistor M2 are turned on. In the case, because the pull-up node PU is connected to the voltage end VSS, the electrical potential of the pull-up node PU is a low potential, and thus, the third transistor M3 is turned off. In addition, the second control transistor M11 is turned on, so that the high level signal outputted from the signal input end (that is, the high-voltage end VGH) can be written into the pull-down control node PD, thereby turning on the fourth transistor M4. The first control transistor M10 is turned on, so that the voltage end VSS is connected to the control electrode of the driving transistor M7 (that is, the pull-up node PU) via the fourth transistor M4 and the first control transistor M10, so that the driving transistor M7 is in the off state in the third period t3.

In the fourth period t4, the second signal CLKB is a low level signal, so that the first transistor M1 and the second transistor M2 are turned off. After the fourth period t4, the second signal CLKB alternates between a high level signal and a low level signal, thereby causing the first transistor M1 and the second transistor M2 to be alternately turned on and off. In a case where the first transistor M1 and the second transistor M2 are turned on, the high level signal outputted from the signal input end can be written into the pull-down control node PD, thereby turning on the fourth transistor M4, and the first control transistor M10 is turned on, so that the voltage end VSS is connected to the control electrode of the driving transistor M7 via the fourth transistor M4 and the first control transistor M10, so that the driving transistor M7 can keep the off state and cannot be incorrectly turned on by a signal which is coupled into the GOA unit. Hence, the GOA does not output incorrect driving signals. In the process of outputting the off signal by the GOA unit, the threshold drift problem caused by long-term conduction of the transistor is prevented while ensuring that the electrical potential of the pull-up node PU is maintained at a low potential. It should be noted that, the second signal CLKB may also have the same timing as the second clock signal CLKB as shown in FIG. 3.

It should be noted that, as shown in FIG. 9, for the GOA unit shown in FIG. 8, the off signal is a low level signal, so that, in the third period t3 and the fourth period t4, the GOA unit outputs the off signal (that is, the low level signal).

Description is given above to the structure of the GOA unit and the working principle of the GOA unit in each cycle period of the GOA unit with reference to the accompanying drawings. As seen from the description, when the GOA unit outputs the off signal, a scenario that the GOA unit is incorrectly switched on and incorrectly outputs a driving signal can be avoided, and hence display errors on the display device can be prevented.

In the embodiments of the present disclosure, the circuit structure of the GOA unit is not limited to the structure as shown in FIG. 8.

Figure 10:
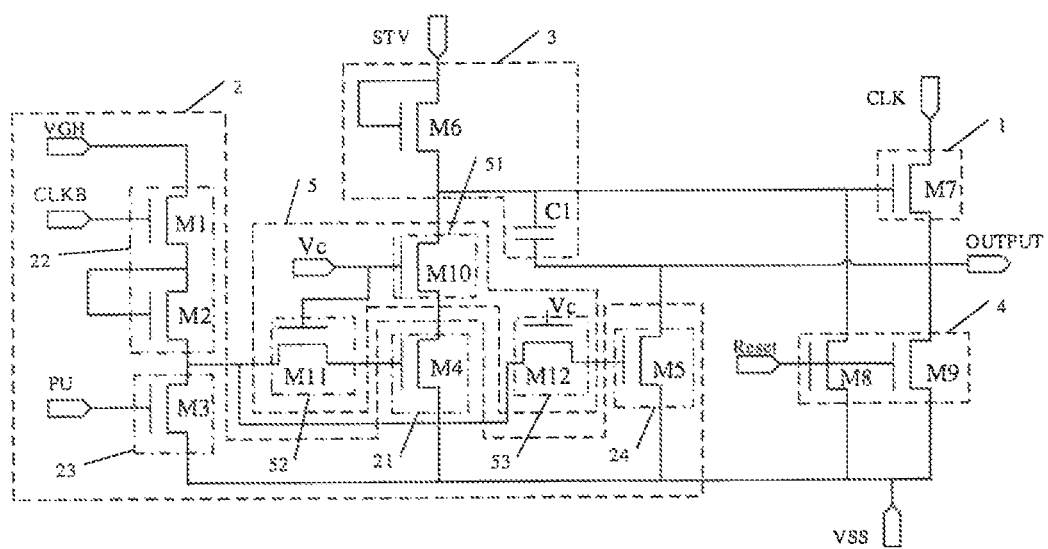
FIG. 10 is a GOA unit provided by another embodiment of the present disclosure.

FIG. 10 is a GOA unit provided by another embodiment of the present disclosure.

As shown in FIG. 10, the pull-down unit 2 further includes a fourth sub-circuit 24. A first end of the fourth sub-circuit 24 is connected with the output end OUTPUT of the GOA unit; a second end of the fourth sub-circuit 24 is connected with the voltage end VSS; and a third end of the fourth sub-circuit 24 is connected with the third end of the second sub-circuit 22 and the third end of the third sub-circuit 23. For example, the third end of the fourth sub-circuit 24 is connected with the third end of the second sub-circuit 22 and the third end of the third sub-circuit 23, for example, through the pull-down control circuit 5.

For example, the fourth sub-circuit 24 may include a fifth transistor M5. A control electrode of the fifth transistor M5 is the third end of the fourth sub-circuit 24 and connected with the third end of the second sub-circuit 22 and the third end of the third sub-circuit 23 through the pull-down circuit 5, that is, the control electrode of the fifth transistor M5 is connected with the drain electrode of the second transistor M2 in the second sub-circuit 22 and the drain electrode of the third transistor M3 in the third sub-circuit 23; a source electrode of the fifth transistor M5 is the second end of the fourth sub-circuit 24 and connected with the voltage end VSS; and a drain electrode of the fifth transistor M5 is the first end of the fourth sub-circuit 24 and connected with the output end OUTPUT of the GOA unit. In the embodiment, when the GOA unit outputs the off signal, both the second end of the first capacitor C1 and the output end OUTPUT are connected with the voltage end VSS, so that the signal outputted from the output end OUTPUT of the GOA unit is further guaranteed to be an off signal, and hence the adverse effect of the signal which is coupled into the GOA unit can be maximally reduced on the GOA unit.

For example, the pull-down control circuit 5 further comprises a third control sub-circuit 53. A first end of the third control sub-circuit 53 is connected with the third end of the fourth sub-circuit 24, a second end of the third control sub-circuit 53 is connected with the third end of the second sub-circuit 22 and the third end of the third sub-circuit 23, and a third end of the third control sub-circuit 53 receives a third sub-circuit control signal.

For example, in some embodiments, the first sub-circuit control signal, the second sub-circuit control signal, and the third sub-circuit control signal may be the same. As shown in FIG. 10, the third end of the first control sub-circuit 51, the third end of the second control sub-circuit 52, and the third end of the third control sub-circuit 53 may be connected to the same control voltage end Vc to receive the same signal, that is, the voltage signal outputted by the control voltage end Vc is used as the first sub-circuit control signal, the second sub-circuit control signal, and the third sub-circuit control signal.

For example, the first sub-circuit control signal may be the voltage signal outputted by the control voltage end Vc, and the second sub-circuit control signal and the third sub-circuit control signal may be the second signal CLKB, or the second sub-circuit control signal and/or the third sub-circuit control signal may also be a separately provided signal. In some examples, the second sub-circuit control signal may also be a third clock signal which is different from the first signal CLK and the second signal CLKB.

For example, the third control sub-circuit 53 comprises a third control transistor M12. A control electrode of the third control transistor M12 is the third end of the third control sub-circuit 53 and receives the third sub-circuit control signal, a drain electrode of the third control transistor M12 is the first end of the third control sub-circuit 53 and is connected to the third end of the fourth sub-circuit 24, and a source electrode of the third control transistor M12 is the second end of the third control sub-circuit 53 and is connected to the third end of the second sub-circuit 22 and the third end of the third sub-circuit 23.

For example, under control of the third control transistor M12, the control electrode of the fifth transistor M5 can be selectively connected to the drain electrode of the second transistor M2 and the drain electrode of the third transistor M3, thereby preventing the voltage of the drain electrode of the second transistor M2 and/or the drain electrode of the third transistor M3 from erroneously turning on the fifth transistor M5.

For example, in some other embodiments, the control electrode of the third control transistor M12 receives the third sub-circuit control signal, the drain electrode of the third control transistor M12 is connected with the third end of the fourth sub-circuit 24, and the source electrode of the third control transistor M12 is connected with the third end of the first sub-circuit 21. In some examples, a source electrode of the third control transistor M12 is connected with the control electrode of the fourth transistor M4. In some examples, at least one of the control electrode of the first control transistor M10, the control electrode of the second control transistor M11 and the control electrode of the third control transistor M12 is connected with the source or drain electrode of the first transistor M1.

For example, as shown in FIG. 10, in some embodiments, the voltage end connected to the source electrode of the third transistor M3, the voltage end connected to the source electrode of the fourth transistor M4, and the voltage end connected to the source electrode of the fifth transistor M5 are the same voltage end, so as to reduce the number of power ports needed to be arranged. In addition, the voltage end connected with the pull-down circuit 2 and the voltage end connected with the reset circuit 4 are the same voltage end so as to reduce the number of the power ports needed to be arranged. That is, as shown in FIG. 10, the source electrode of the third transistor M3, the source electrode of the fourth transistor M4, the source electrode of the fifth transistor M5, the source electrode of the eighth transistor M8, and the source electrode of the ninth transistor M9 are all connected with the same voltage end VSS.

It should be noted that, other circuit configurations of the GOA unit shown in FIG. 10 are substantially the same as those of the GOA unit shown in FIG. 8, and repeated portions are not described herein again.

Figure 11:
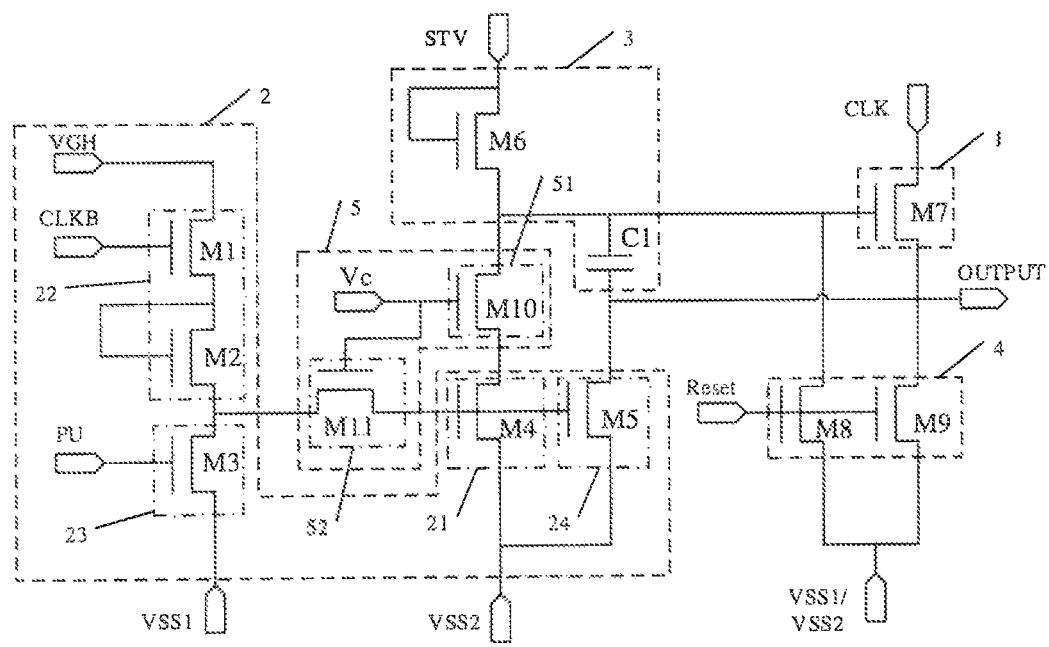
FIG. 11 is a circuit schematic diagram of a GOA unit provided by another embodiment of the present disclosure.

FIG. 11 is a circuit schematic diagram of a GOA unit provided by another embodiment of the present disclosure.

In other embodiments of the present disclosure, the pull-down circuit 2 may also be connected with a plurality of low-voltage ends. For example, the voltage end connected to the first end of the third sub-circuit 23 and the voltage end connected to the second end of the first sub-circuit 21 are different voltage ends, for example, an absolute value (such as, 6 volts (V)) of a voltage output by the voltage end connected to the first end of the third sub-circuit 23 is greater than an absolute value (such as, 5 V) of a voltage output by the voltage end connected to the second end of the first sub-circuit 21, and/or a difference between an absolute value of a voltage output by the voltage end connected to the first end of the third sub-circuit 23 and an absolute value of a voltage output by the voltage end connected to the second end of the first sub-circuit 21 ranges from 0 volt to 3 volts, for example, the difference can range from 0V to 8V or from 1.2V to 5V.

Figure 13:
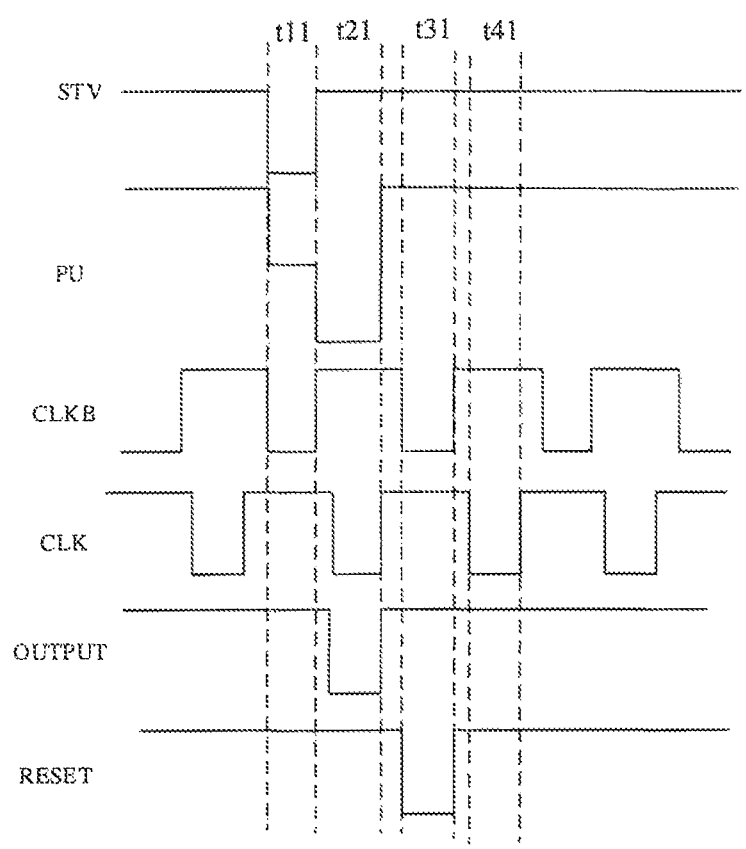
FIG. 13 is a timing sequence diagram of signals in a GOA unit provided by another embodiment of the present disclosure.

It should be noted that, a difference between an absolute value of a voltage output by the voltage end connected to the first end of the third sub-circuit 23 and an absolute value of the voltage (that is, the first sub-circuit control signal) of the control electrode of the first control transistor M10 can range from 0V to 8V, which can prevent the third transistor M3 from being turned on by mistake, which cause the gate-source voltage of the first control transistor M10 is higher than the threshold voltage of the first control transistor M10 so as to cause the first control transistor M10 to be turned on by mistake, when the GOA unit outputs an on signal (for example, for the embodiment shown in FIG. 9, the on signal is a high level signal, for the embodiment shown in FIG. 13, the on signal is a low level signal).

For example, in some embodiments, as shown in FIG. 11, the source electrode of the third transistor M3 is connected to a first voltage end VSS1, the source electrode of the fourth transistor M4 is connected to a second voltage end VSS2, the source electrode of the fifth transistor M5 is connected to the second voltage end VSS2. An absolute value of a voltage output by the first voltage end VSS1 is greater than an absolute value of a voltage output by the second voltage end VSS2, and/or a difference between the absolute value of a voltage output by the first voltage end VSS1 and the absolute value of a voltage output by the second voltage end VSS2 ranges from 0 volt to 3 volts.

It should be noted that, the source electrode of the fourth transistor M4 and the source electrode of the fifth transistor M5 may also be respectively connected to different voltage ends. For example, the source electrode of the fifth transistor M5 may be connected to a third voltage end (not shown, the third voltage end is different from the first voltage end and the second voltage end).

For example, as shown in FIG. 11, the source electrode of the eighth transistor M8 and the source electrode of the ninth transistor M9 may be connected to the first voltage end VSS1 or the second voltage end VSS2. However, the present disclosure is not limited thereto, the voltage end connected with the pull-down circuit 2 and the voltage end connected with the reset circuit 4 may be different voltage ends, as long as the voltage signals outputted by the voltage ends that are connected with the pull-down circuit 2 or the reset circuit 4 can drive the driving transistor M7 to be switched off.

In the embodiments of the present disclosure, a voltage inputted from the signal input end may be equal to a turn-on voltage of the gate driver circuit. For instance, a voltage outputted from the high-voltage end VGH may be equal to the turn-on voltage of the gate driver circuit. In this case, by direct utilization of the existing high voltage in the gate driver circuit, the number of the power ports can be reduced, and hence the circuit structure can be simplified.

For example, for a wiring structure of the GOA unit, a gate signal line connected to the control electrode of the second control transistor M11 is located between a first voltage signal line connected to the first voltage end VSS1 and a second voltage signal line connected to the second voltage end VSS2, and a line width of the gate signal line is smaller than a line width of the first voltage signal line and/or a line width of the second voltage signal line. An active semiconductor layer of the fourth transistor M4, an active semiconductor layer of the sixth transistor M6, and an active semiconductor layer of the seventh transistor M7 are connected together, that is, may be an integral structure.

Figure 12C:
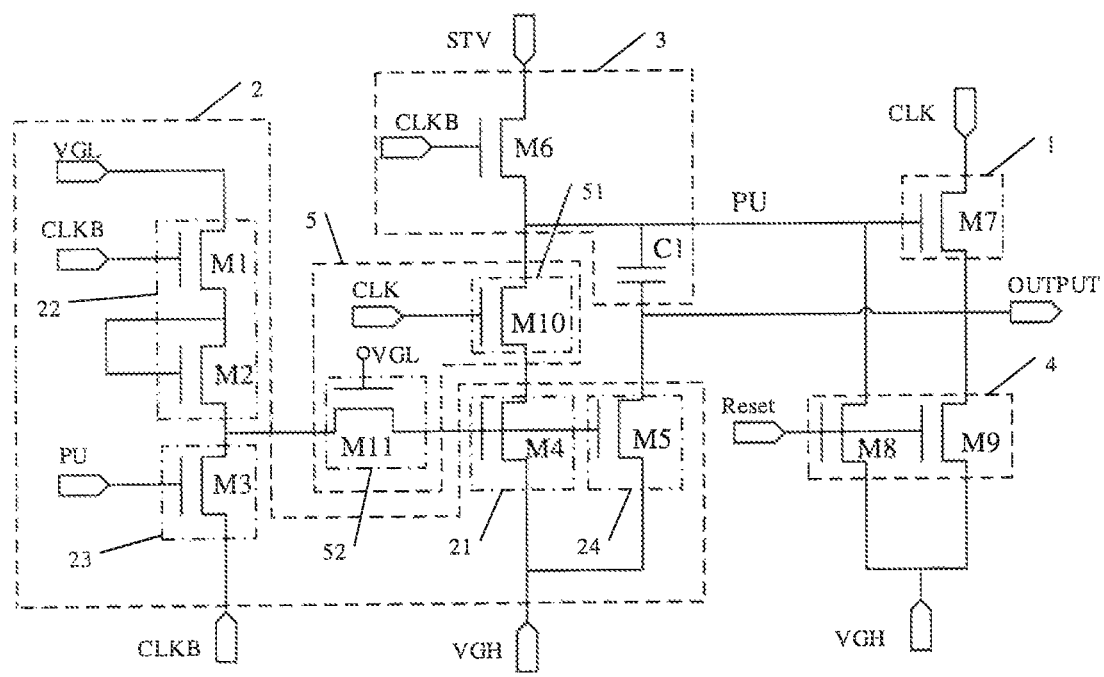
FIG. 12C is a circuit schematic diagram of still another GOA unit provided by still another embodiment of the present disclosure.

FIG. 12A is a circuit schematic diagram of a GOA unit provided by still another embodiment of the present disclosure, FIG. 12B is a circuit schematic diagram of another GOA unit provided by still another embodiment of the present disclosure, and FIG. 12C is a circuit schematic diagram of still another GOA unit provided by still another embodiment of the present disclosure.

For example, in the embodiments shown in FIG. 12A to FIG. 12C, the GOA unit is implemented by P-type transistors, in this case, the at least one voltage end is a high voltage end, the voltage signal provided by the at least one voltage end VSS is a high-voltage signal, the reset voltage signal is a high-voltage signal, the signal input end is a low-voltage end, and the input voltage outputted from the signal input end is a low-voltage signal.

For example, as shown in FIG. 12A, the first sub-circuit 21 comprises a fourth transistor M4, the second sub-circuit 22 comprises a first transistor M1 and a second transistor M2, the third sub-circuit 23 comprises a third transistor M3, the fourth sub-circuit 24 comprises a fifth transistor M5, the driver circuit 6 comprises a driving transistor M7, the pull-up circuit 3 comprises a sixth transistor M6 and a first capacitor C1, the reset circuit 4 comprises an eighth transistor M8 and a ninth transistor M9, the first control sub-circuit 51 comprises a first control transistor M10, and the second control sub-circuit 52 comprises a second control transistor M11.

For example, a control electrode of the first transistor M1 receives the second signal CLKB, a drain electrode of the first transistor M1 is connected to the signal input end (that is, the low-voltage end VGL), a source electrode of the first transistor M1 is connected to a drain electrode of the second transistor M2 and a control electrode of the second transistor M2, and a source electrode of the second transistor M2 is connected to a source electrode of the third transistor M3 and a drain electrode of the second control transistor M11.

For example, a drain electrode of the third transistor M3 is configured to receive the first signal CLK, a control electrode of the third transistor M3 is connected to the pull-up node PU (that is, a control electrode of the driving transistor M7), and a source electrode of the third transistor M3 is connected to the source electrode of the second transistor M2 and the drain electrode of the second control transistor M11.

For example, a control electrode of the fourth transistor M4 is connected to a source electrode of the second control transistor M11, a drain electrode of the fourth transistor M4 is connected to a high-voltage end VGH, and a source electrode of fourth transistor M4 is connected to a drain electrode of the first control transistor M10.

For example, a control electrode of the fifth transistor M5 is connected to the source electrode of the second control transistor M11, a drain electrode of the fifth transistor M5 is connected to the high-voltage end VGH, and a source electrode of fifth transistor M5 is connected to the output end OUTPUT of the GOA unit.

For example, a control electrode of the sixth transistor M6 and a drain electrode of the sixth transistor M6 are configured to receive the pull-up signal STV, a source electrode of the sixth transistor M6 is connected with the pull-up node PU (that is, the control electrode of the driving transistor M7). A first end of the first capacitor C1 is connected between the sour electrode of the sixth transistor M6 and the pull-up node PU (that is, the control electrode of the driving transistor M7), and a second end of the first capacitor C1 is connected to the output end OUTPUT of the GOA unit.

For example, the control electrode of the driving transistor M7 is connected to the pull-up node PU, a drain electrode of the driving transistor M7 receives the first signal CLK, and a source electrode of the driving transistor M7 is connected to the output end OUTPUT of the GOA unit.

For example, a control electrode of the eighth transistor M8 is connected to the signal reset end Reset, a drain electrode of the eighth transistor M8 is connected to the high-voltage end VGH, and a source electrode of the eighth transistor M8 is connected to the pull-up node PU (that is, the control electrode of the driving transistor M7). A control electrode of the ninth transistor M9 is connected to the signal reset end Reset, a drain electrode of the ninth transistor M9 is connected to high-voltage end VGH, and a source electrode of the ninth transistor M9 is connected to the output end OUTPUT of the GOA unit.

For example, a control electrode of the first control transistor M10 is configured to receive the second signal CLKB, a drain electrode of the first control transistor M10 is connected to the source electrode of the fourth transistor M4, and a source electrode of the first control transistor M10 is connected to the pull-up node PU. A control electrode of the second control transistor M11 is configured to receive the second signal CLKB, a drain electrode of the second control transistor M11 is connected to the source electrode of the second transistor M2 and the source electrode of the third transistor M3, and a source electrode of the second control transistor M11 is connected to the control electrode of the fourth transistor M4. That is, in this case, the first sub-circuit control signal is the second signal CLKB, and the second sub-circuit control signal is also the second signal CLKB.

For example, in some embodiments, in a case where the pull-down control circuit 5 comprises a third control sub-circuit 53 and the third control sub-circuit 53 comprises a third control transistor M12, a control electrode of the third control transistor M12 is configured to receive the second signal CLKB, a drain electrode of the third control transistor M12 is connected to the source electrode of the second transistor M2 and the source electrode of the third transistor M3, and a source electrode of the third control transistor M12 is connected to the control electrode of the fifth transistor M5. That is, in this case, the third sub-circuit control signal is also the second signal CLKB.

For example, the embodiment shown in FIG. 12B is substantially identical to the embodiment shown in FIG. 12A except that: in the embodiment shown in FIG. 12B, the control electrode of the sixth transistor M6 is configured to receive the second signal CLKB, and the control electrode of the second control transistor M11 is connected to a low-voltage end VGL to receive a low-voltage signal. It should be noted that other circuit configuration of the GOA unit shown in FIG. 12B is substantially the same as those of the GOA unit shown in FIG. 12A, and the repeated portions are not described herein again.

For example, the embodiment shown in FIG. 12C is substantially identical to the embodiment shown in FIG. 12A except that: in the embodiment shown in FIG. 12C, the control electrode of the first control transistor M10 receives the first signal CLK, the drain electrode of the third transistor M3 receives the second signal CLKB, the control electrode of the sixth transistor M6 is configured to receive the second signal CLKB, and the control electrode of the second control transistor M11 is connected to a low-voltage end VGL to receive a low-voltage signal. It should be noted that other circuit configuration of the GOA unit shown in FIG. 12C is substantially the same as those of the GOA unit shown in FIG. 12A, and the repeated portions are not described herein again.

It should be noted that, in the embodiments shown in FIGS. 12A to 12C, a difference between an absolute value of the low-voltage signal provided by the low-voltage end VGL and an absolute value of one of the first signal CLK and the second signal CLKB range from 0V to 6V, thereby preventing the fourth transistor M4 and the first control transistor M10 from being turned on by mistake due to the difference between the absolute value of the low-voltage signal and the absolute value of one of the first signal CLK and the second signal CLKB being too large when the GOA unit outputs an on signal.

FIG. 13 is a timing sequence diagram of signals in a GOA unit provided by another embodiment of the present disclosure.

As shown in FIG. 13, taking the GOA unit shown in FIG. 12A as an example, an operating process of elements in the GOA unit provided by the embodiments of the present disclosure may include a first period t11, a second period t21, a third period t31, and a fourth period t41. It should be noted that, the embodiments shown in FIG. 12B and FIG. 12C can refer to the timing sequence diagram shown in FIG. 13.

In the first period t11, the second signal CLKB is a low level signal, so that the first transistor M1, the second transistor M2, the first control transistor M10, and the second control transistor M11 are all turned on. The signal outputted from the signal reset end Reset is a high level signal, and thus the eighth transistor M8 and the ninth transistor M9 are turned off. The pull-up signal STV is a low level signal, so that the sixth transistor M6 is turned on, the pull-up signal STV is inputted to the pull-up node PU to pull down the electrical potential of the pull-up node PU to an operation potential. In this case, the first end of the first capacitor C1 is discharged, so that the driving transistor M7 is turned on, and hence the first signal CLK is outputted from the output end OUTPUT through the driving transistor M7 and inputted into the second end of the first capacitor C1. And meanwhile, because the signal of the pull-up node PU is a low level signal (that is, the pull-up signal), the third transistor M3 is turned on, in addition, the second control transistor M11 is also turned on, so that the control electrode of the fourth transistor M4 receives the first signal CLK, because the first signal CLK is a high level signal, and hence the fourth transistor M4 is turned off in the first period t11.

In the second period t21, the second signal CLKB becomes a high level signal, so that the first transistor M1, the second transistor M2, the first control transistor M10, and the second control transistor M11 are all turned off. The pull-up signal STV signal becomes a high level signal, so that the sixth transistor M6 is turned off, and hence the pull-up node PU maintains a low level and is in the flooding state. Because the first signal CLK becomes a low level signal, so that the output end OUTPUT of the GOA unit outputs a low level signal. Meanwhile, the second end of the first capacitor C1 is discharged so that the first capacitor C1 is subjected to bootstrapping, and hence the electric potential of the pull-up node PU can be further reduced. In the case, although the third transistor M3 is turned on under control of the pull-up node PU and the first signal CLK becomes a low level signal, because the second control transistor M11 is turned off, so that the control electrode of the fourth transistor M4 is a floating state, and therefore, the fourth transistor M4 remains to be turned off.

In the third period t31, the signal outputted by the signal reset end Reset changes from a high level signal to a low level signal, so that the eighth transistor M8 and the ninth transistor M9 can be turned on, and hence the pull-up node PU is connected with the high-voltage end VGH and the output end OUTPUT of the GOA unit is also connected with the high-voltage end VGH, so the driving transistor M7 is turned off, and the GOA unit outputs an off signal. The second signal CLKB becomes a low level signal, so the first transistor M1, the second transistor M2, the first control transistor M10, and the second control transistor M11 are turned on. Because the pull-up node PU is connected to the high-voltage end VGH, the electrical potential of the pull-up node PU is a high potential, and therefore, the third transistor M3 is turned off. Because the first transistor M1, the second transistor M2, and the second control transistor M11 are turned on, a low level signal output by the low-voltage end VGL can be written into the pull-down control node PD (that is, the node between the source electrode of the second control transistor M11 and the control electrode of the fourth transistor M4) via the first transistor M1, the second transistor M2, and the second control transistor M11, thereby turning on the fourth transistor M4, moreover, the first control transistor M10 is turned on, so that the high-voltage end VGH is connected to the control electrode of the driving transistor M7 (that is, the pull-up node PU) via the fourth transistor M4 and the first control transistor M10, so that the driving transistor M7 is turned off in the third period t31.

In the fourth period t41, the second signal CLKB becomes a high level signal, so that the first transistor M1, the second transistor M2, the first control transistor M10, and the second control transistor M11 are all turned off. After the fourth period t41, the second signal CLKB alternates between a high level signal and a low level signal, thereby causing the first transistor M1, the second transistor M2, the first control transistor M10, and the second control transistor M11 to be alternately turned on and off. In the process of outputting the off signal by the GOA unit, the threshold drift problem caused by long-term conduction of the transistor is prevented while ensuring that the electrical potential of the pull-up node PU is maintained at a high potential.

It should be noted that, as shown in FIG. 13, for the GOA unit shown in FIG. 12A, the off signal is a high level signal, so that, in the third period t31 and the fourth period t41, the GOA unit outputs the off signal (that is, the high level signal).

It should be noted that in the embodiments of the present disclosure, for example, in a case where each circuit is implemented as an N-type transistor, the term "pull-up" means charging a node or an electrode of a transistor so as to raise an absolute value of a level of the node or a level of the electrode, thereby implementing an operation (e.g., turn-on) of a corresponding transistor; the term "pull-down" means discharging a node or an electrode of a transistor so that an absolute value of a level of the node or the electrode is decreased, thereby implementing an operation (e.g., turn-off) of the corresponding transistor. The term "operation potential" represents that a node is at a high potential, so that in a case where a gate electrode of a transistor is connected to the node, the transistor is turned on; the term "non-operation potential" represents that a node is at a low potential, so that in a case where a gate electrode of a transistor is connected to the node, the transistor is turned off. For another example, in a case where each circuit is implemented as a P-type transistor, the term "pull-up" means discharging a node or an electrode of a transistor, so that an absolute value of a level of the node or the electrode is decreased, thereby achieving an operation (e.g., turn-on) of a corresponding transistor; and the term "pull-down" means charging a node or an electrode of a transistor, so that an absolute value of a level of the node or the electrode is increased, thereby achieving an operation (e.g., turn-off) of a corresponding transistor. The term "operation potential" represents that a node is at a low potential, so that in a case where a gate electrode of a transistor is connected to the node, the transistor is turned on; and the term "non-operation potential" represents that a node is at a high potential, so that in a case where a gate electrode of a transistor is connected to the node, the transistor is turned off.

The embodiments of the present disclosure further provide a gate driver circuit, which comprises the GOA unit provided by the above-described embodiments.

The gate driver circuit provided by the embodiments adopt the GOA unit provided by the above-described embodiments and can avoid the incorrect switching-on of various rows of pixels corresponding to various stages of GOA units respectively, so that various rows of pixels cannot be charged and display incorrect images, and hence the "abnormal image" phenomenon can be overcome.

The embodiments of the present disclosure further provide a display device, which comprises the gate driver circuit provided by the above-described embodiments.

For example, the display device may be an organic light-emitting diode (OLED) display device, a liquid crystal display (LCD) device, and the like.

The display device provided by the embodiments adopts the gate driver circuit in the above embodiments and can avoid the incorrect switching-on of various rows of pixels corresponding to various stages of GOA units respectively, so that various rows of pixels cannot be charged and display incorrect images, and hence the "abnormal image" phenomenon can be overcome.

It should be understood that the above embodiments are only example embodiments adopted for illustrating the principle of the present disclosure and not intended to limit the present disclosure. Various modifications and improvements may be made by those skilled in the art without departing from the spirit and the essence of the present disclosure and shall also fall within the scope of protection of the present disclosure.

What is claimed is:

1. A gate on array (GOA) unit, comprising: a driver circuit, a pull-down circuit, and a pull-down control circuit, wherein
    the driver circuit is configured to output a first signal from an output end of the GOA unit;
    the pull-down circuit is connected with a control end of the driver circuit through the pull-down control circuit, the pull-down circuit is also connected with at least one voltage end that provides a voltage signal, the pull-down circuit is configured to input the voltage signal into the control end of the driver circuit to drive the driver circuit to be in an off state when the GOA unit outputs an off signal; and
    the pull-down control circuit is connected with the pull-down circuit and the driver circuit, and is configured to control the pull-down circuit to input the voltage signal to the control end of the driver circuit;
    wherein the pull-down circuit includes a first sub-circuit, a second sub-circuit, and a third sub-circuit;
    a first end of the first sub-circuit is connected with the control end of the driver circuit; a second end of the first sub-circuit is connected with the at least one voltage end; a third end of the first sub-circuit is connected with the second sub-circuit and the third sub-circuit;
    a first end of the second sub-circuit is connected with a signal input end; a second end of the second sub-circuit is connected with a second signal; a third end of the second sub-circuit is connected with the third end of the first sub-circuit;
    a first end of the third sub-circuit is connected with the at least one voltage end; a second end of the third sub-circuit is connected with the control end of the driver circuit; and a third end of the third sub-circuit is connected with the third end of the first sub-circuit.

2. The GOA unit according to claim 1, wherein the pull-down control circuit comprises a first control sub-circuit and a second control sub-circuit,
    a first end of the first control sub-circuit is connected with the control end of the driver circuit, a second end of the first control sub-circuit is connected with the first end of the first sub-circuit, and a third end of the first control sub-circuit receives a first sub-circuit control signal,
    a first end of the second control sub-circuit is connected with the third end of the first sub-circuit, a second end of the second control sub-circuit is connected with the third end of the second sub-circuit and the third end of the third sub-circuit, and a third end of the second control sub-circuit receives a second sub-circuit control signal.

3. The GOA unit according to claim 2, wherein a polarity of a voltage output by a voltage end connected to the first end of the third sub-circuit is opposite to a polarity of the first sub-circuit control signal.

4. The GOA unit according to claim 2, wherein the pull-down circuit further includes a fourth sub-circuit;
    a first end of the fourth sub-circuit is connected with the output end of the GOA unit; a second end of the fourth sub-circuit is connected with the at least one voltage end; and a third end of the fourth sub-circuit is connected with the third end of the second sub-circuit and the third end of the third sub-circuit.

5. The GOA unit according to claim 4, wherein the pull-down control circuit further comprises a third control sub-circuit,
    a first end of the third control sub-circuit is connected with the third end of the fourth sub-circuit, a second end of the third control sub-circuit is connected with the third end of the second sub-circuit and the third end of the third sub-circuit, and a third end of the third control sub-circuit receives a third sub-circuit control signal.

6. The GOA unit according to claim 1, wherein the second sub-circuit includes a first transistor and a second transistor;
    a control electrode of the first transistor is the second end of the second sub-circuit and connected with the second signal; a source electrode of the first transistor is the first end of the second sub-circuit and connected with the signal input end; a drain electrode of the first transistor is connected with a control electrode and a source electrode of the second transistor;
    a drain electrode of the second transistor is the third end of the second sub-circuit and connected with the third end of the first sub-circuit; and
    an input voltage signal or the second signal is inputted from the signal input end.

7. The GOA unit according to claim 1, wherein the second sub-circuit includes a first transistor and a second transistor, the second end of the second sub-circuit comprises a control electrode of the first transistor and a control electrode of the second transistor,
    the control electrode of the first transistor receives the second signal; a source electrode of the first transistor is the first end of the second sub-circuit and connected with the signal input end; a drain electrode of the first transistor is connected with a source electrode of the second transistor;
    the control electrode of the second transistor receives the second signal, a drain electrode of the second transistor is the third end of the second sub-circuit and connected with the third end of the first sub-circuit; and
    an input voltage signal or the second signal is inputted from the signal input end.

8. The GOA unit according to claim 1, wherein the third sub-circuit includes a third transistor;
    a control electrode of the third transistor is the second end of the third sub-circuit and connected with the control end of the driver circuit; a source electrode of the third transistor is the first end of the third sub-circuit and connected with the at least one voltage end; and a drain electrode of the third transistor is the third end of the third sub-circuit and connected with the third end of the first sub-circuit.

9. The GOA unit according to claim 1, wherein the first sub-circuit includes a fourth transistor;
a control electrode of the fourth transistor is the third end of the first sub-circuit and connected with the second sub-circuit and the third sub-circuit; a source electrode of the fourth transistor is the second end of the first sub-circuit and connected with the at least one voltage end; and a drain electrode of the fourth transistor is the first end of the first sub-circuit and connected with the control end of the driver circuit.

10. The GOA unit according to claim 4, wherein the fourth sub-circuit includes a fifth transistor;
a control electrode of the fifth transistor is the third end of the fourth sub-circuit and connected with the third end of the second sub-circuit and the third end of the third sub-circuit; a source electrode of the fifth transistor is the second end of the fourth sub-circuit and connected with the at least one voltage end; and a drain electrode of the fifth transistor is the first end of the fourth sub-circuit and connected with the output end of the GOA unit.

11. The GOA unit according to claim 2, wherein the first control sub-circuit comprises a first control transistor, and the second control sub-circuit comprises a second control transistor,
a control electrode of the first control transistor is the third end of the first control sub-circuit and receives the first sub-circuit control signal, a drain electrode of the first control transistor is the first end of the first control sub-circuit and is connected to the control end of the driver circuit, and a source electrode of the first control transistor is the second end of the first control sub-circuit and is connected to the first end of the first sub-circuit,
a control electrode of the second control transistor is the third end of the second control sub-circuit and receives the second sub-circuit control signal, a drain electrode of the second control transistor is the first end of the second control sub-circuit and is connected to the third end of the first sub-circuit, and a source electrode of the second control transistor is the second end of the second control sub-circuit and is connected to the third end of the second sub-circuit and the third end of the third sub-circuit.

12. The GOA unit according to claim 5, wherein the third control sub-circuit comprises a third control transistor,
a control electrode of the third control transistor is the third end of the third control sub-circuit and receives the third sub-circuit control signal, a drain electrode of the third control transistor is the first end of the third control sub-circuit and is connected to the third end of the fourth sub-circuit, and a source electrode of the third control transistor is the second end of the third control sub-circuit and is connected to the third end of the second sub-circuit and the third end of the third sub-circuit.

13. The GOA unit according to claim 1, further comprising a pull-up circuit, wherein an output end of the pull-up circuit is connected with the driver circuit so as to input a pull-up signal into the driver circuit; and the pull-up signal is configured to drive the driver circuit to be switched on,
the driver circuit includes a driving transistor;
a control electrode of the driving transistor is the control end of the driver circuit and connected with the output end of the pull-up circuit; a source electrode of the driving transistor receives the first signal; and a drain electrode of the driving transistor is connected with the output end of the GOA unit.

14. The GOA unit according to claim 13, further comprising a reset circuit, wherein the reset circuit is connected with the driver circuit and configured to input a reset voltage signal into the control end of the driver circuit and the output end of the GOA unit; and the reset voltage signal is configured to drive the driver circuit to be switched off and pull down a signal outputted by the GOA unit.

15. The GOA unit according to claim 13, wherein a phase of the first signal is opposite to a phase of the second signal,
the pull-up circuit includes a sixth transistor and a first capacitor;
a control electrode of the sixth transistor receives the second signal, and a source electrode of the sixth transistor is connected with the pull-up signal; a drain electrode of the sixth transistor is connected with the control electrode of the driving transistor;
a first end of the first capacitor is connected between the drain electrode of the sixth transistor and the control electrode of the driving transistor; and a second end of the first capacitor is connected with the output end of the GOA unit.

16. The GOA unit according to claim 14, wherein the reset circuit includes an eighth transistor and a ninth transistor;
a control electrode of the eighth transistor is connected with a signal reset end; a source electrode of the eighth transistor is connected with the at least one voltage end to receive the reset voltage signal; a drain electrode of the eighth transistor is connected with the control end of the driver circuit;
a control electrode of the ninth transistor is connected with the signal reset end; a source electrode of the ninth transistor is connected with the at least one voltage end to receive the reset voltage signal; and a drain electrode of the ninth transistor is connected with the output end of the GOA unit, and
the second signal is outputted from the signal reset end.

17. A gate driver circuit, comprising the GOA unit according to claim 1.

18. A display device, comprising the gate driver circuit according to claim 17.

19. A gate on array (GOA) unit, comprising: a driver circuit, a pull-down circuit, and a pull-down control circuit, wherein
the driver circuit is configured to output a first signal from an output end of the GOA unit;
the pull-down circuit is connected with a control end of the driver circuit through the pull-down control circuit, the pull-down circuit is also connected with at least one voltage end that provides a voltage signal, the pull-down circuit is configured to input the voltage signal into the control end of the driver circuit to drive the driver circuit to be in an off state when the GOA unit outputs an off signal; and
the pull-down control circuit is connected with the pull-down circuit and the driver circuit, and is configured to control the pull-down circuit to input the voltage signal to the control end of the driver circuit;
wherein the pull-down circuit includes a first sub-circuit, a second sub-circuit, and a third sub-circuit; the at least one voltage end comprises a first signal voltage end and a second signal voltage end,
a first end of the first sub-circuit is connected with the control end of the driver circuit; a second end of the first sub-circuit is connected with the first signal voltage end; a third end of the first sub-circuit is connected with the second sub-circuit and the third sub-circuit;

a first end of the second sub-circuit is connected with a signal input end; a second end of the second sub-circuit is connected with a second signal; a third end of the second sub-circuit is connected with the third end of the first sub-circuit;

a first end of the third sub-circuit is connected with the second signal voltage end; a second end of the third sub-circuit is connected with the control end of the driver circuit; and a third end of the third sub-circuit is connected with the third end of the first sub-circuit.

20. The GOA unit according to claim 19, wherein the first signal voltage end and the second signal voltage end are different voltage ends, an absolute value of a voltage output by the second signal voltage end is greater than an absolute value of a voltage output by the first signal voltage end, and/or a difference between an absolute value of a voltage output by the second signal voltage end and an absolute value of a voltage output by the first signal voltage end ranges from 0 volt to 3 volts.

* * * * *